(12) United States Patent
Cheong et al.

(10) Patent No.: US 8,883,596 B2
(45) Date of Patent: Nov. 11, 2014

(54) SEMICONDUCTOR DEVICE WITH VERTICAL CHANNEL TRANSISTOR AND METHOD OF FABRICATING THE SAME

(71) Applicant: Samsung Electronics Co., Ltd., Gyeonggi-do (KR)

(72) Inventors: Seonghwee Cheong, Suwon-si (KR); Mansug Kang, Suwon-si (KR); Joon Kim, Seoul (KR); Kihong Nam, Seongnam-si (KR); Gyuwan Choi, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/790,076

(22) Filed: Mar. 8, 2013

(65) Prior Publication Data

US 2013/0302959 A1 Nov. 14, 2013

(30) Foreign Application Priority Data

May 10, 2012 (KR) ........................ 10-2012-0049763

(51) Int. Cl.
| | | |
|---|---|---|
| *H01L 29/66* | (2006.01) | |
| *H01L 27/108* | (2006.01) | |
| *H01L 27/105* | (2006.01) | |
| *H01L 27/22* | (2006.01) | |
| *H01L 27/24* | (2006.01) | |

(52) U.S. Cl.
CPC .... *H01L 29/66666* (2013.01); *H01L 27/10876* (2013.01); *H01L 27/1052* (2013.01); *H01L 27/228* (2013.01); *H01L 27/2454* (2013.01)

USPC .......... 438/270; 438/268; 438/269; 438/272; 438/589; 257/E29.166

(58) Field of Classification Search
USPC .......................................... 438/269–272, 589
See application file for complete search history.

(56) References Cited

U.S. PATENT DOCUMENTS

| | | | |
|---|---|---|---|
| 7,742,328 B2 | 6/2010 | Chen et al. | |
| 7,843,750 B2 | 11/2010 | Park et al. | |
| 8,211,769 B2 * | 7/2012 | Lee ............................... | 438/270 |
| 2001/0032989 A1 | 10/2001 | Koh et al. | |
| 2002/0109163 A1 | 8/2002 | Forbes et al. | |
| 2002/0110039 A1 | 8/2002 | Forbes et al. | |
| 2004/0094786 A1 | 5/2004 | Tran et al. | |
| 2004/0155281 A1 | 8/2004 | Osada et al. | |

(Continued)

FOREIGN PATENT DOCUMENTS

| | | |
|---|---|---|
| JP | 2011-096829 | 5/2011 |
| JP | 2011-159946 | 8/2011 |

(Continued)

*Primary Examiner* — Angel Roman
(74) *Attorney, Agent, or Firm* — Lee & Morse, P.C.

(57) ABSTRACT

A semiconductor device with vertical channel transistors and a method of fabricating the same are provided. A method of fabricating the semiconductor device includes patterning a substrate to form a trench that defines an active region, forming a sacrificial pattern in a lower region of the trench, forming a spacer on an upper sidewall of the trench, recessing a top surface of the sacrificial pattern to form a window exposing a sidewall of the active region between the spacer and the sacrificial pattern, doping a sidewall of the trench through the window to form a doped region in the active region, and forming a wiring in the trench to be connected to the doped region.

14 Claims, 43 Drawing Sheets

(56) References Cited

U.S. PATENT DOCUMENTS

| | | |
|---|---|---|
| 2010/0213527 A1 | 8/2010 | Shim et al. |
| 2011/0104868 A1* | 5/2011 | Ujihara et al. ............... 438/425 |
| 2011/0186970 A1 | 8/2011 | Sung |
| 2011/0201173 A1 | 8/2011 | Miyahara |
| 2011/0233662 A1* | 9/2011 | Mikasa ........................ 257/330 |
| 2011/0248327 A1 | 10/2011 | Son et al. |
| 2011/0284942 A1 | 11/2011 | Dong et al. |
| 2011/0298046 A1 | 12/2011 | Hong |
| 2011/0303974 A1 | 12/2011 | Kim et al. |
| 2011/0304028 A1 | 12/2011 | Kim |
| 2012/0007218 A1 | 1/2012 | Kim |
| 2012/0112270 A1* | 5/2012 | Park et al. ..................... 257/330 |
| 2012/0135573 A1* | 5/2012 | Kim .............................. 438/270 |
| 2012/0208364 A1* | 8/2012 | Rouh et al. ................... 438/666 |

FOREIGN PATENT DOCUMENTS

| | | |
|---|---|---|
| JP | 2011-243942 | 12/2011 |
| JP | 2012-004230 | 1/2012 |
| KR | 10-2011-0052068 A | 5/2011 |
| KR | 10-2011-0078022 A | 7/2011 |

* cited by examiner

SEMICONDUCTOR DEVICE WITH VERTICAL CHANNEL TRANSISTOR AND METHOD OF FABRICATING THE SAME

CROSS-REFERENCE TO RELATED APPLICATION

The present application claims priority under 35 U.S.C. §119 to Korean Patent Application No. 10-2012-0049763, filed on May 10, 2012, in the Korean Intellectual Property Office, and entitled: "Semiconductor Device with Vertical Channel Transistor and Method of Fabricating the Same," which is incorporated herein in its entirety.

BACKGROUND

A two-dimensional semiconductor device, such as metal oxide semiconductor field effect transistor (MOSFET), may have a source electrode and a drain electrode disposed at opposite sides of a channel region, respectively. A semiconductor device having a vertical channel transistor may similarly include a source electrode and a drain electrode disposed at opposite sides of a channel region.

SUMMARY

Embodiments may be realized by providing a method of fabricating a semiconductor device that includes patterning a substrate to form a trench that defines an active region, forming a sacrificial pattern in a lower region of the trench, forming a spacer on an upper sidewall of the trench, recessing a top surface of the sacrificial pattern to form a window exposing a sidewall of the active region between the spacer and the sacrificial pattern, doping a sidewall of the trench through the window to form a doped region in the active region, and forming a wiring in the trench to be connected to the doped region.

Forming the sacrificial pattern may include forming an insulating layer to cover an inner surface of the trench, forming a sacrificial layer to fill the trench that has the insulating layer therein, and recessing the sacrificial layer to form the sacrificial pattern localized in the lower region of the trench. The spacer may include a material having etch selectivity with respect to at least one of the insulating layer and the sacrificial layer.

An upper boundary of the window may be formed to be defined by a bottom surface of the spacer, and a lower boundary of the window may be formed to be defined by an upper surface of the sacrificial pattern that has been recessed. The doped region may be formed spaced apart from a bottom surface of the trench.

Forming the doped region may include forming a semiconductor layer to fill the trench that has the sacrificial pattern therein, anisotropically etching the semiconductor layer to form a semiconductor pattern locally remaining between the spacer and the sacrificial pattern, doping the semiconductor pattern with impurities, and diffusing the impurities into the active region.

The doped region may be formed to have a different conductivity type from the substrate. The method may include removing the sacrificial pattern, after forming the window and before forming the wiring. The method may include removing the spacer, after forming the window and before forming the wiring. The method may include forming a semiconductor pattern in the trench, and forming the wiring may include forming a metal layer in the trench having the semiconductor pattern therein, recessing the metal layer to form a metal pattern in the lower region of the trench, and forming an insulating gapfill layer to fill the trench provided with the metal pattern.

Embodiments may also be realized by providing a semiconductor device that includes a substrate including an active region defined by a trench, a doped region provided in the active region, which the doped region is arranged in a sidewall of the active region and a conductivity type of the doped region is different from a conductivity type of a portion of the substrate below the trench, a wiring electrically connected to the doped region through a sidewall of the trench, a lower insulating pattern between the wiring and a bottom surface of the trench, and an upper insulating pattern in an upper region of the trench.

A horizontal width of the doped region may be smaller than a horizontal width of the active region. A bottom surface of the doped region may be spaced upward apart from the bottom surface of the trench.

The wiring may include a metal pattern crossing the active region in a horizontal direction. A semiconductor pattern may be locally interposed between sidewalls of the metal pattern and the doped region and the semiconductor pattern may have the same conductivity type as the doped region.

The semiconductor pattern may be smaller than the metal pattern, in terms of both of vertical and horizontal widths. The semiconductor pattern may have a bottom surface that is located at a level spaced upward apart from the bottom surface of the trench.

Embodiments may also be realized by providing a method of fabricating a semiconductor device that includes forming a trench in a substrate, depositing a sacrificial pattern in a lower region of the trench, forming a spacer in an upper region of the trench, which trench has the sacrificial pattern in the lower region thereof, after forming the spacer, recessing the sacrificial pattern to form windows on opposite sides of the trench, which windows are between a lower side of the spacer and an upper side of the sacrificial pattern after being recessed, depositing and patterning a semiconductor layer in the trench such that semiconductor patterns fill the windows, doping sidewalls of the trench through the semiconductor patterns in the windows to form doped regions, respectively, in the substrate, and forming a wiring in the lower region of the trench between the semiconductor patterns.

The method may include forming an insulating layer on the sidewalls of the trench before depositing the sacrificial pattern, and may include removing portions of the insulating layer from the windows before depositing and patterning the semiconductor layer such that the semiconductor patterns are embedded between remaining portions of the insulating layer. The method may include depositing a gapfill pattern in the upper region of the trench such that the wiring is only in the lower region of the trench.

The semiconductor patterns may be formed such that first sides of the semiconductor patterns are in direct contact with the sidewalls of the trench, respectively, and the wiring may be formed such that second sides of the semiconductor patterns are in direct contact with the wiring. The trench may be one of a plurality trenches that are formed in the substrate such that a plurality of vertical channel transistors are within the plurality of trenches, respectively.

BRIEF DESCRIPTION OF THE DRAWINGS

Features will become apparent to those of ordinary skill in the art by describing in detail exemplary embodiments with reference to the attached drawings in which:

FIGS. 8A through 24A illustrate perspective views depicting stages in a method of fabricating a semiconductor device according to example embodiments.

FIGS. 8B through 24B illustrate sectional views taken along lines A-A, B-B, C-C, and D-D of FIGS. 8A through 24A, respectively, in which the stages in the method of fabricating the semiconductor device are depicted.

DETAILED DESCRIPTION

Figure 1:
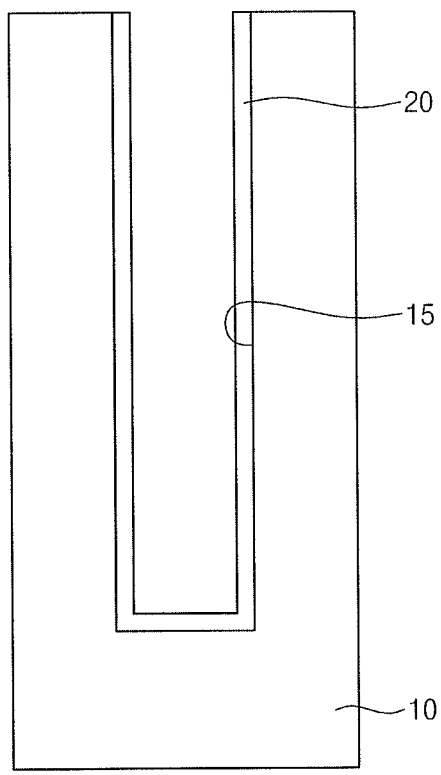
FIGS. 1 through 6 illustrate sectional views depicting stages in a method of fabricating a semiconductor device according to example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout. It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, e.g., of manufacturing techniques and/or tolerances, are to be expected. Thus, example embodiments should not be construed as limited to the particular shapes of regions illustrated herein but are to include deviations in shapes that result, for example, from manufacturing.

For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of layers, regions and/or structural elements may be reduced or exaggerated for clarity. The use of similar or identical reference numbers in the various drawings is intended to indicate the presence of a similar or identical element or feature.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIGS. 1 through 6 illustrate sectional views exemplarily depicting stages in a method of fabricating a semiconductor device according to example embodiments.

Figure 2:
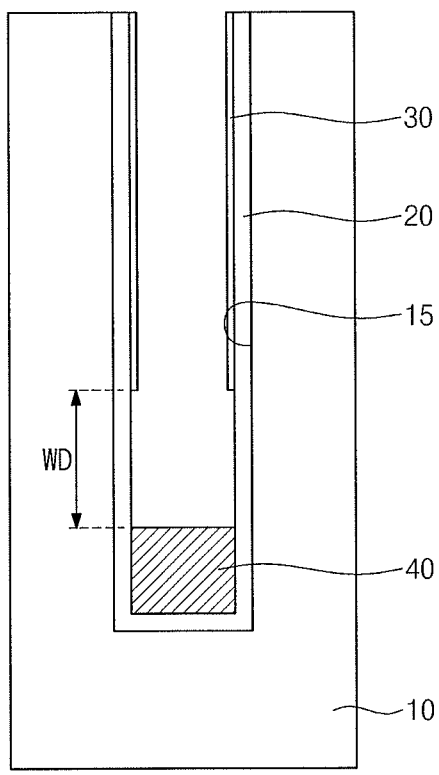

Referring to FIGS. 1 and 2, a substrate 10 may be patterned to form a trench 15 defining active patterns ACT. An insulating layer 20 may be formed to cover, e.g., conformally cover an entirety of, an inner sidewall of the trench 15. A sacrificial pattern 40 may be formed in a lower region of the trench 15 provided with the insulating layer 20. For example, the sacrificial pattern 40 may fill, e.g., completely fill, the lower region of the trench 15 so that an upper region of the trench 15 remains unfilled.

In example embodiments, the insulating layer 20 may be formed by a chemical vapor deposition or an atomic layer deposition technique. In other embodiments, the insulating layer 20 may be a silicon oxide layer, which may be formed by thermally oxidizing an exposed surface of the substrate 10.

The formation of the sacrificial pattern 40 may include forming a sacrificial layer to fill the trench 15 provided with the insulating layer 20, and then etching the sacrificial layer using an etch recipe having an etching selectivity with respect to the insulating layer 20 so that the insulating layer 20 may remain within the trench 15. In example embodiments, the sacrificial pattern 40 may include a polysilicon layer.

Referring to FIG. 2, a spacer 30 may be formed on an inner surface of the trench provided with the sacrificial pattern 40. Then, a top surface of the sacrificial pattern 40 may be recessed using the spacer 30 as an etch mask. Accordingly, as shown, a window WD may be formed between the spacer 30 and the sacrificial pattern 40 to expose a side surface of the insulating layer 20. For example, the window WD may be formed between an upper surface of the sacrificial pattern 40 and a lower surface of the spacer 30.

The spacer 30 may include at least one of materials having an etching selectivity with respect to the sacrificial pattern 40. Furthermore, the spacer 30 may include at least one of materials having an etching selectivity with respect to both of the sacrificial pattern 40 and the insulating layer 20. For example, in the case where the insulating layer 20 and the sacrificial pattern 40 are formed of a silicon oxide layer and a polysilicon layer, respectively, the spacer 30 may include a silicon nitride layer.

The formation of the spacer 30 may include forming a spacer layer to cover, e.g., conformally cover, the structure provided with the sacrificial pattern 40. Then, anisotropically etching the spacer layer to expose a top surface of the sacrificial pattern 40.

Figure 3:
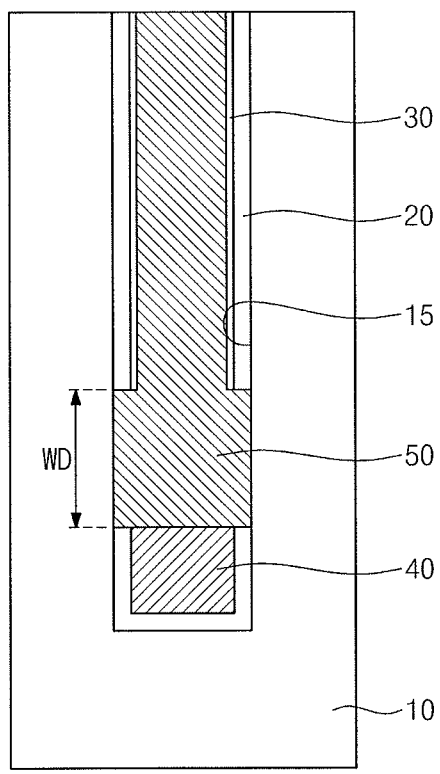

Referring to FIG. 3, the insulating layer 20 exposed by the window WD may be etched to expose the inner side surface of the active pattern ACT. Then, a semiconductor layer 50 may be formed to fill the trench 15, e.g., the semiconductor layer 50 may fill the window WD and the upper region of the trench 15 having the spacer 30 therein.

The etching of the insulating layer 20 may be performed using an etch recipe having etching selectivity with respect to the spacer 30 and the sacrificial pattern 40. In example embodiments, the insulating layer 20 may be etched using an isotropic etching technique. For example, hydrofluoric acid may be used to etch selectively the insulating layer 20.

The semiconductor layer 50 may be formed of the same material as the substrate 10. In example embodiments, the semiconductor layer 50 may be a substantially intrinsic polysilicon layer. However, in other embodiments, the semiconductor layer 50 may be a doped polysilicon layer having different conductivity type from the substrate 10.

Figure 4:
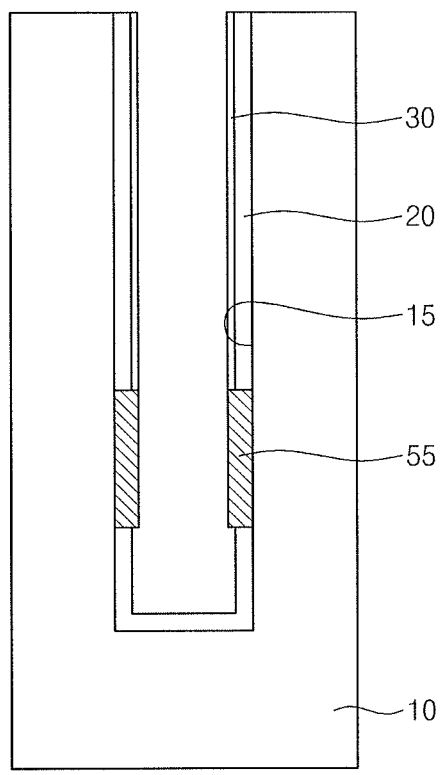

Referring to FIG. 4, the semiconductor layer 50 may be etched to form a semiconductor pattern 55 localized within the window WD. The formation of the semiconductor pattern 55 may include anisotropically etching the semiconductor layer 50 using the insulating layer 20 and/or the spacer 30 as an etch mask.

In example embodiments, the sacrificial pattern 40 may be removed during the formation of the semiconductor pattern 55. For example, in the case where the sacrificial pattern 40 is formed of the same material as the semiconductor layer 50, the sacrificial pattern 40 may be removed during the step of etching anisotropically the semiconductor layer 50. However, in other embodiments, the sacrificial pattern 40 may be removed by an additional isotropic etching process that is performed independently.

Figure 5:
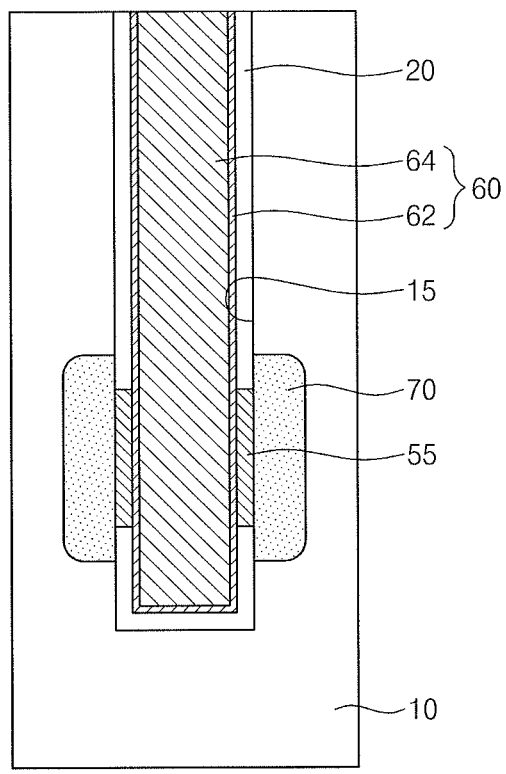

Referring to FIG. 5, the semiconductor pattern 55 may be doped with impurities, and the impurities may be diffused to form a doped region 70 in the active pattern ACT. The formation of the doped region 70 may include performing a thermal treatment to the doped semiconductor pattern 55. For example, the formation of the doped region 70 may be performed using one of rapid thermal annealing techniques. The doped region 70 may be formed to have a different conductivity type from the substrate 10 or the active pattern ACT. For example, in the case where the substrate 10 is p-type, arsenic may be used as the impurities.

Thereafter, a conductive layer 60 may be formed to fill the trench 15. For example, the conductive layer 60 may include a first conductive layer 62 having a surface in direct contact with the semiconductor pattern 55 and a second conductive layer 64 filling the trench 15 provided with the first conductive layer 62. In example embodiments, the first conductive layer 62 may include at least one of transition metals or nitrides thereof. The second conductive layer 64 may include at least one of metals, whose resistivity is smaller than that of the first conductive layer 62. In example embodiments, the first conductive layer 62 may react with the semiconductor pattern 55, such that a metal silicide layer (not shown) may be formed between the first conductive layer 62 and the semiconductor pattern 55.

In example embodiments, the sacrificial pattern 40 may remain at the lower region of the trench 15, such that it may be interposed between the conductive layer 60 and the insulating layer 20. In example embodiments, as shown, the spacer 30 may be removed before the formation of the conductive layer 60.

Figure 6:
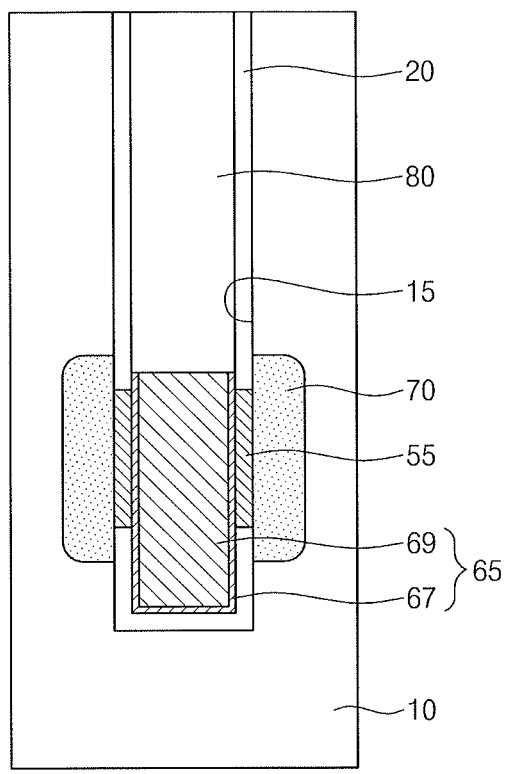

Referring to FIG. 6, the conductive layer 60 may be recessed to form a conductive pattern 65, whose top surface is spaced apart from an upper entrance of the trench 15. For example, during the step of recessing the conductive layer 60, the first and second conductive layers 62 and 64 may be etched to form first and second conductive patterns 67 and 69, respectively, constituting the conductive pattern 65. The conductive pattern 65 may be used as an electrical path (e.g., interconnection line), allowing an electric signal to be delivered to the doped region 70.

Thereafter, a gapfill pattern 80 may be formed on the conductive pattern 65 to fill an upper region of the trench 15. The gapfill pattern 80 may include at least one of insulating materials (e.g., silicon oxide). In example embodiments, before the formation of the gapfill pattern 80, a portion of the insulating layer 20 positioned on the semiconductor pattern 55 may be horizontally etched or removed.

A method of fabricating described with reference to FIGS. 1 through 6 may be used to fabricate a semiconductor device including vertical channel transistors. For example, the semiconductor device including the vertical channel transistors is disclosed in U.S. patent application Ser. Nos. 13/097,343, 13/097,365, and 13/291,457, filed on Apr. 29, 2011, Apr. 29, 2011, and Nov. 8, 2011, respectively, in the United States Patent & Trademark Office, the entire contents of all of which are incorporated herein by reference as part of this application, and embodiments therein may be applied to realize semiconductor devices described therein. Hereinafter, it will be described, as a non-restrictive example, an exemplary embodiment as applied to realize the semiconductor devices described in U.S. patent application Ser. No. 13/291,457.

Figure 7:
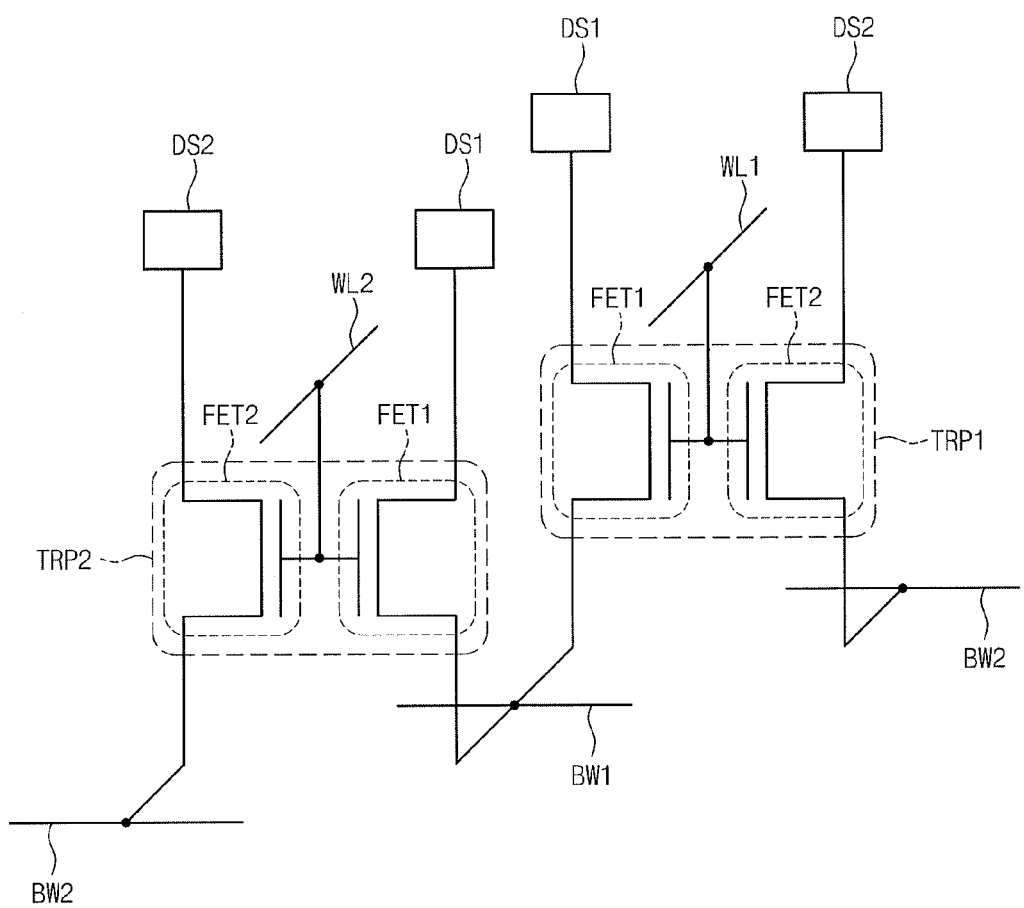
FIG. 7 illustrates a circuit diagram of a portion of a semiconductor device according to example embodiments.

FIG. 7 illustrates a circuit diagram of a portion of a semiconductor device according to example embodiments.

Referring to FIG. 7, semiconductor device may include a plurality of transistor-pairs TRP1 and TRP2. For example, as illustrated in FIG. 7, the semiconductor device may include a first transistor-pair TRP1 and a second transistor-pair TRP2 provided adjacent to each other. Each of the first and second transistor-pairs TRP1 and TRP2 may include a first vertical channel transistor FET1 and a second vertical channel transistor FET2. Gate electrodes of the first and second vertical channel transistors FET1 and FET2 of the first transistor-pair TRP1 may be electrically connected to a first word line WL1. That is, the first and second vertical channel transistors FET1 and FET2 of the first transistor-pair TRP1 may share the first word line WL1. Similarly, gate electrodes of the first and second vertical channel transistors FET1 and FET2 of the second transistor-pair TRP2 may share a second word line WL2. The first and second word lines WL1 and WL2 may be independently controlled.

Drain terminals of the first vertical channel transistors FET1 may be electrically connected to a first buried wiring BW1, and drain terminals of the second vertical channel transistors FET2 may be electrically connected to a second buried wiring BW2. The first and second buried wirings BW1 and BW2 may be independently controlled. The word lines WL1 and WL2 may cross the buried wirings BW1 and BW2. The drain terminal of the first vertical channel transistor FET1 in the first transistor-pair TRP1 may share the first buried wiring BW1 along with the drain terminal of the first vertical channel transistor FET1 in the second transistor-pair TRP2 adjacent thereto. Similarly, the drain terminal of the second vertical channel transistor FET2 in the first transistor-pair TRP1 may share the second buried wiring BW2 along with a drain terminal of a second vertical channel transistor FET2 in a third transistor-pair (not shown) adjacent thereto. In example embodiments, the first and second buried wirings BW1 and BW2 may serve as bit lines.

Therefore, according to an exemplary embodiment, the first and second vertical channel transistors FET1 and FET2 in each of the transistor-pairs TRP1 and TRP2 may share one of the word lines WL1 and WL2 and may be electrically connected to a pair of buried wirings BW1 and BW2, respectively. Further, each of the buried wirings BW1 and BW2 may be shared by a pair of the transistor-pairs TRP1 and TRP2 disposed adjacent to each other.

In example embodiments, first data storage elements DS1 may be electrically connected to source terminals of the first vertical channel transistors FET1, respectively. Similarly, second data storage elements DS2 may be electrically connected to source terminals of the second vertical channel transistors FET2, respectively. One of the first vertical channel transistors FET1 and the first data storage element DS1 connected thereto may constitute a unit memory cell. Similarly, one of the second vertical channel transistors FET2 and the second data storage element DS2 connected thereto may constitute another unit memory cell. Each of the first and second vertical channel transistors FET1 and FET2 may be used as a switching device of the respective unit memory cells. As a result, each of the first and second transistor-pairs TRP1 and TRP2 and the first and second data storage elements DS1 and DS2 connected thereto may constitute a pair of unit memory cells. The data storage elements DS1 and DS2 may be realized in various forms. For example, each of the data storage elements DS1 and DS2 may include a capacitor, a magnetic tunnel junction (MTJ) pattern, or a variable resistor.

Accordingly, the semiconductor devices according to example embodiments may be used as a volatile memory device or a non-volatile memory device. For example, the semiconductor devices may be used as a dynamic random access memory (DRAM) device, a static random access memory (SRAM) device, a magnetic random access memory (MRAM) device, a phase changeable random access memory (PRAM) device, or a resistive random access memory (RRAM) device. However, the data storage elements DS1 and DS2 may not be limited to thereto. That is, the data storage elements DS 1 and DS2 may be realized in many different forms.

FIGS. 8A through 24A illustrate perspective views depicting stages in a method of fabricating a semiconductor device according to example embodiments, and FIGS. 8B through 24B are sectional views taken along lines A-A, B-B, C-C, and D-D of FIGS. 8A through 24A, respectively.

Figure 8A:
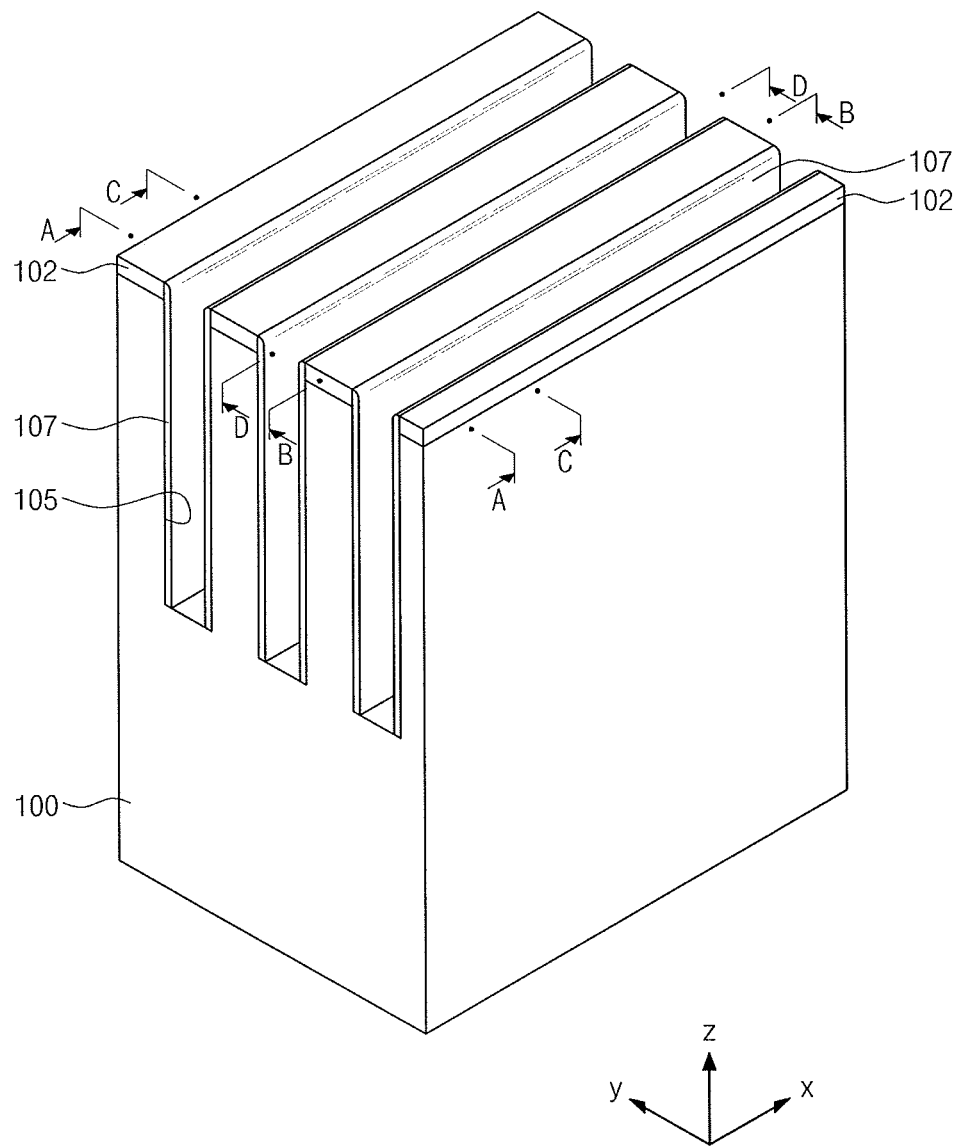
Figure 8B:
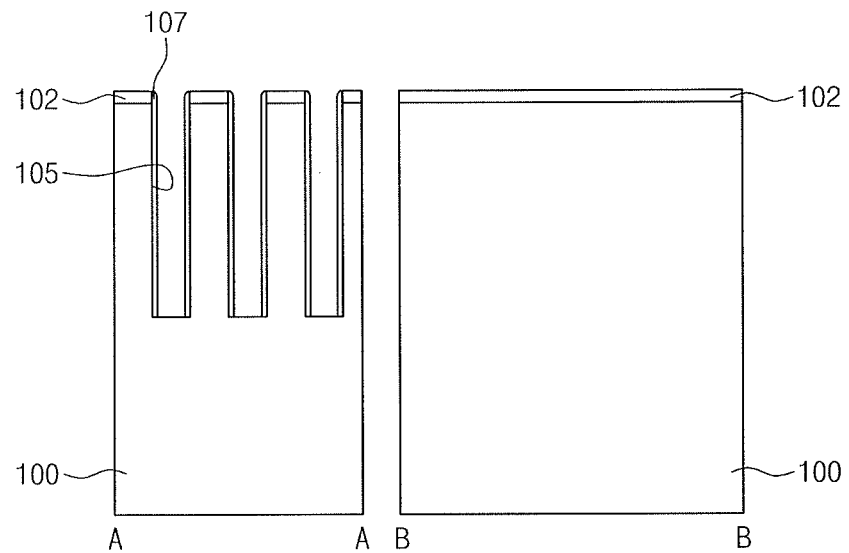
Figure 8B:
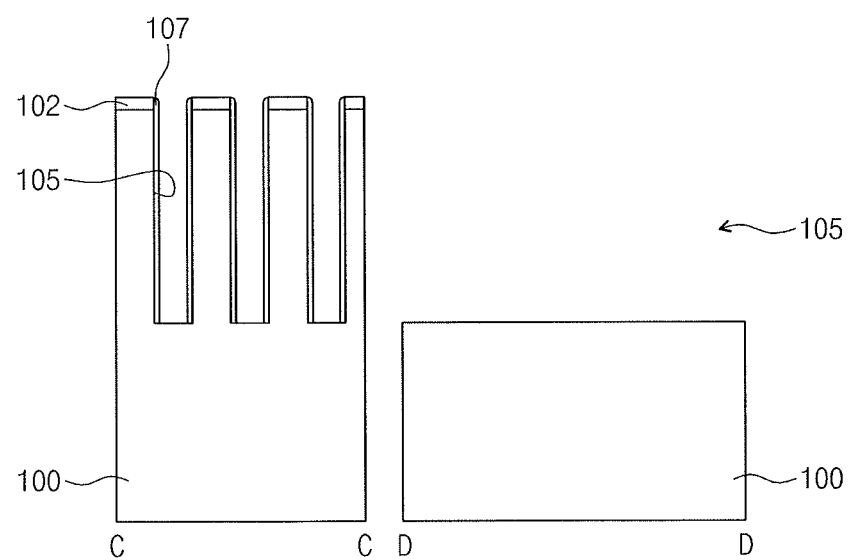

Referring to FIGS. 8A and 8B, hard mask patterns 102 may be formed on a semiconductor substrate 100 (hereinafter, referred to as a substrate). The hard mask patterns 102 may extend parallel to a first direction. The hard mask patterns 102 may be separated from each other in a second direction perpendicular to the first direction. The first and second directions may be parallel with a top surface of the substrate 100. For example, the first direction may correspond to an x-axis direction (e.g., a direction parallel to an x-axis) in FIG. 8A, and the second direction may correspond to a y-axis direction (e.g., a direction parallel to a y-axis) in FIG. 8A.

Each of the hard mask patterns 102 may include an oxide material, a nitride material and/or an oxynitride material. Each of the hard mask patterns 102 may be formed to have a single-layered structure or a multi-layered structure. In example embodiments, the hard mask patterns 102 may be formed of an oxide material.

The substrate 100 may be etched using the hard mask patterns 102 as etching masks. As a result, upper trenches 105 may be formed in the substrate 100. The upper trenches 105 may be formed parallel to the first direction. A sacrificial spacer layer may be conformably formed on the substrate having the upper trenches 105. The sacrificial spacer layer may be etched back until bottom surfaces of the upper trenches 105 are exposed, thereby forming sacrificial spacers 107 on both inner sidewalls of the upper trenches 105. The sacrificial spacer layer may be formed to have a single-layered structure or a multi-layered structure. For example, the sacrificial spacer layer may include an oxide material, a nitride material and/or an oxynitride material. According to another exemplary embodiment, the sacrificial spacer layer may include an oxide layer and a nitride layer that are sequentially stacked on the substrate having the upper trenches 105, and in this case, each of the sacrificial spacers 107 may have a double-layered structure.

Figure 9A:
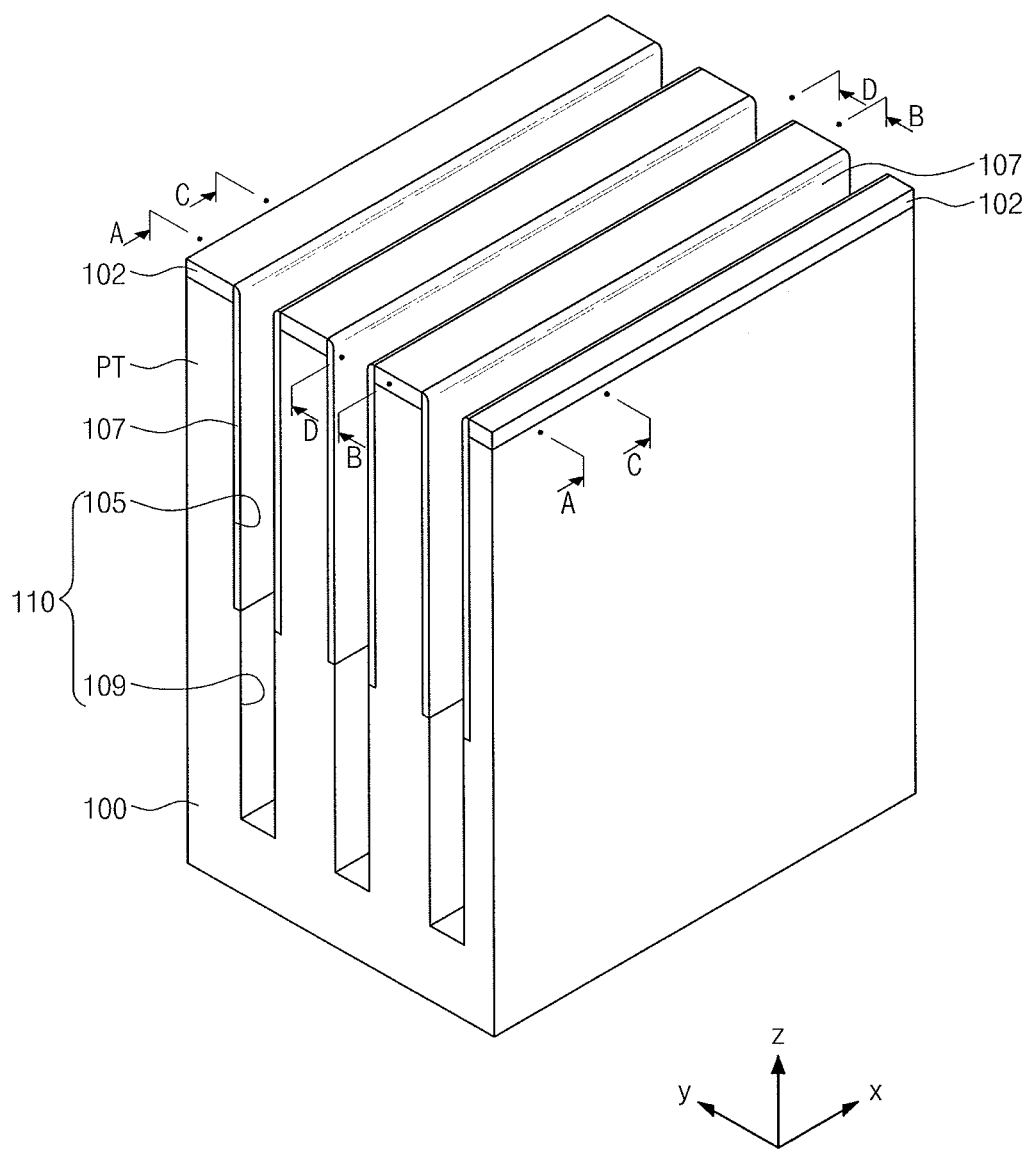
Figure 9B:
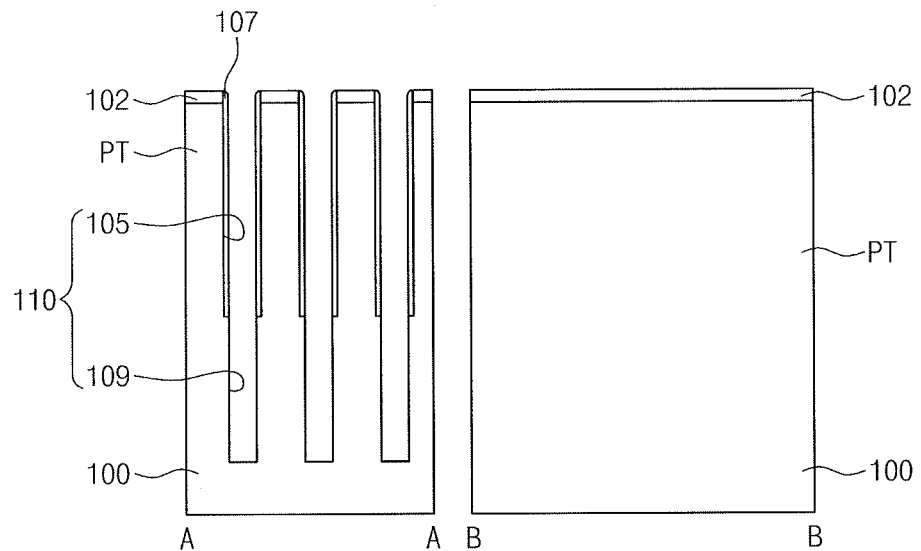
Figure 9B:
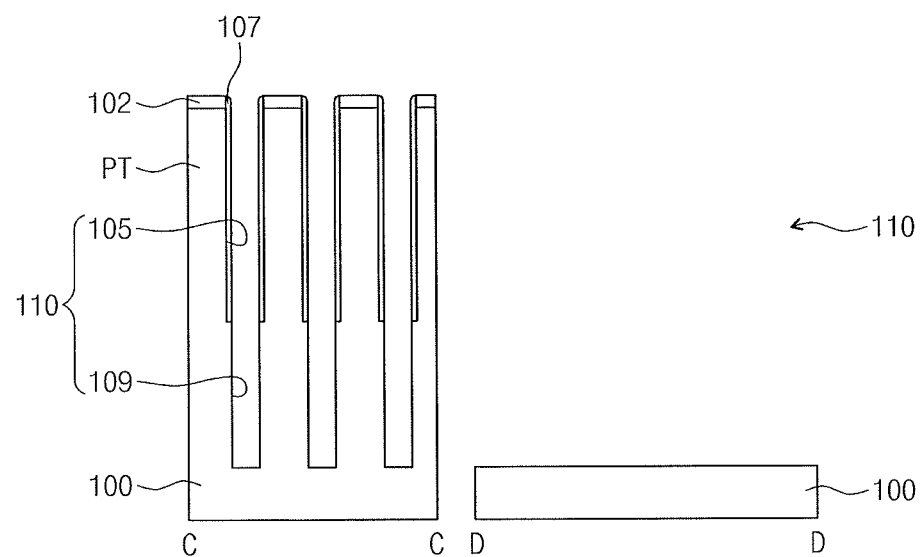

Referring to FIGS. 9A and 9B, bottom surfaces of the upper trenches 105 may be etched to form lower trenches 109. The formation of the lower trenches 109 may be performed using the hard mask patterns 102 and sacrificial spacers 107 as an etch mask. For example, the lower trench 109 may be formed by etching the bottom surface of the upper trench 105 that is exposed by the sacrificial spacers 107 in the upper trench 105. One of the lower trenches 109 and the upper trenches 105 thereon may together constitute a single continuous first trench 110.

The first trenches 110 may define fin patterns PT within the substrate 100. Each of the fin patterns PT may correspond to a portion of the substrate 100 located between two adjacent first trenches 110. The fin patterns PT within the substrate 100 may also extend parallel to the first direction and be separated from each other in the second direction.

Figure 10A:
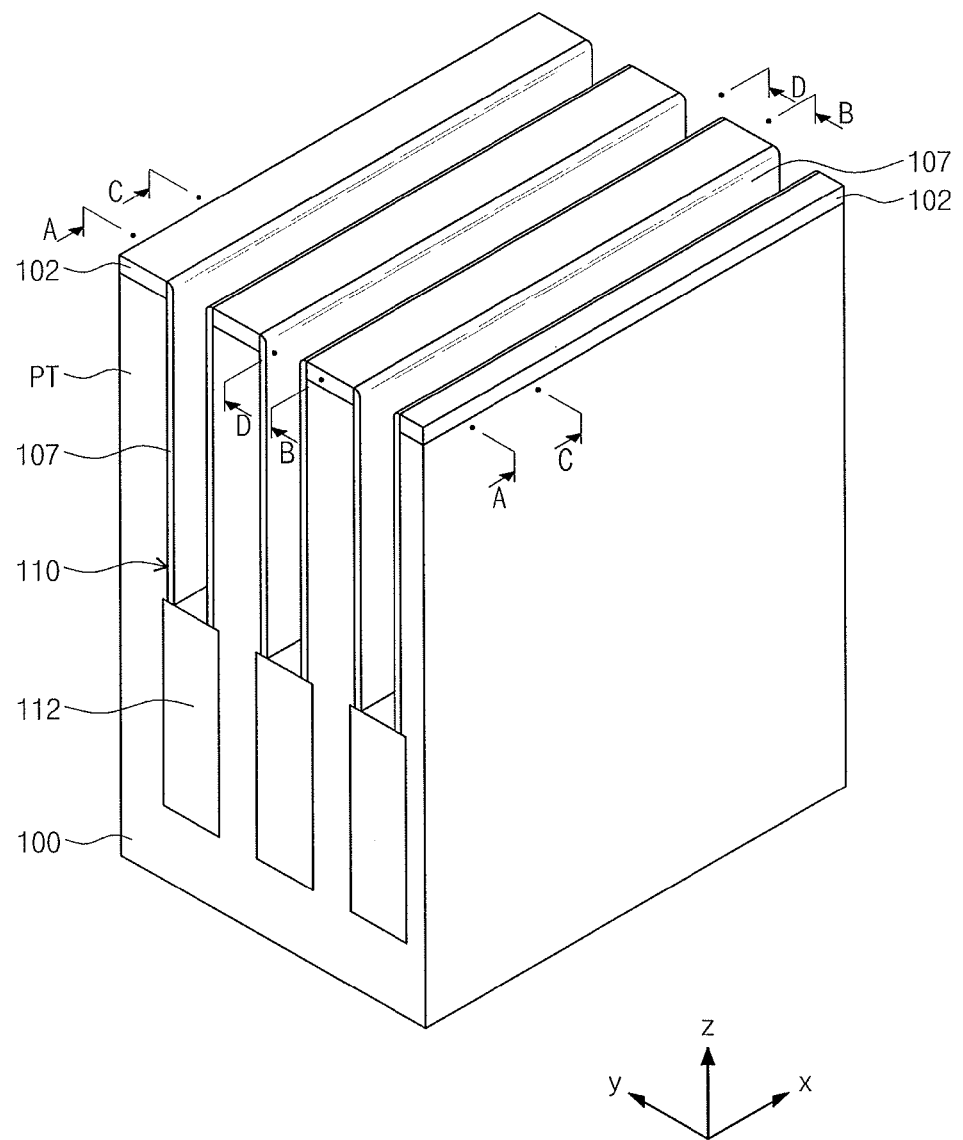
Figure 10B:
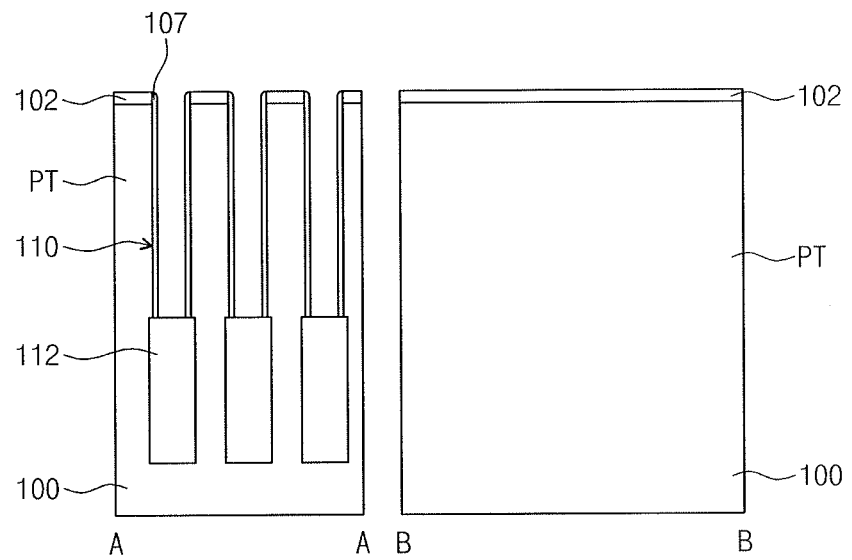
Figure 10B:
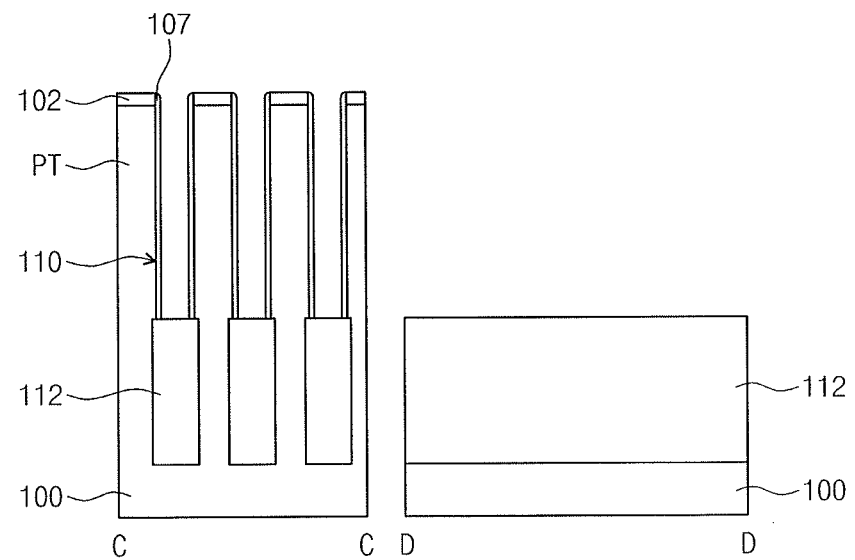

Referring to FIGS. 10A and 10B, a plurality of buried dielectric patterns 112 may be formed in lower regions of the first trenches 110, respectively. For example, a first oxidation process may be performed to the substrate having the first trenches 110, thereby forming the buried dielectric patterns 112. In example embodiments, the first oxidation process may be performed to the substrate provided with the sacrificial spacers 107. Accordingly, upper inner sidewalls of the first trenches 110 may not be oxidized, as illustrated in FIGS. 10A and 10B, because the upper inner sidewalls of the first trenches 110 are covered with the sacrificial spacers 107. As a result, the buried dielectric patterns 112 may be formed to have a confined shape in the lower regions of the first trenches 110, respectively. The first oxidation process may include at least one of a thermal oxidation process, a plasma oxidation process, a thermal/plasma oxidation process, or a radical oxidation process.

Figure 11A:
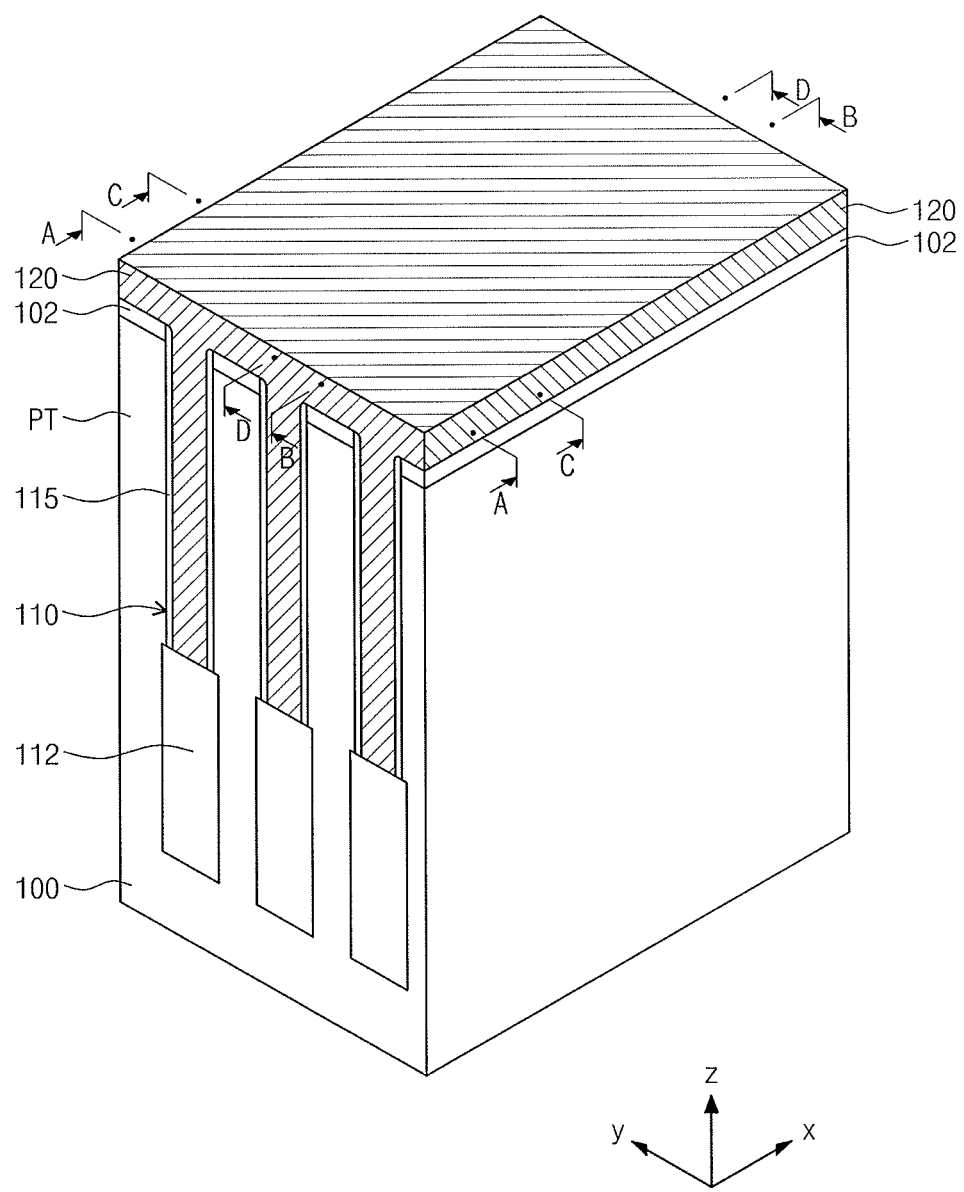
Figure 11B:
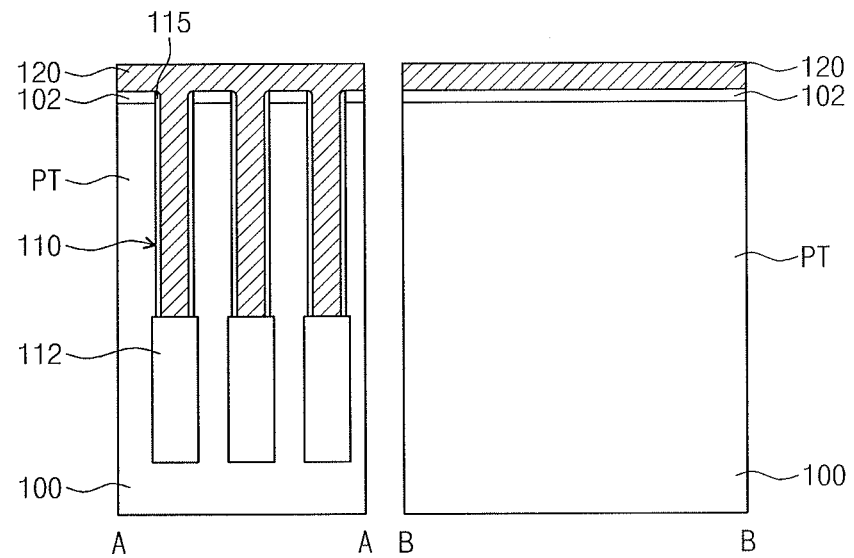
Figure 11B:
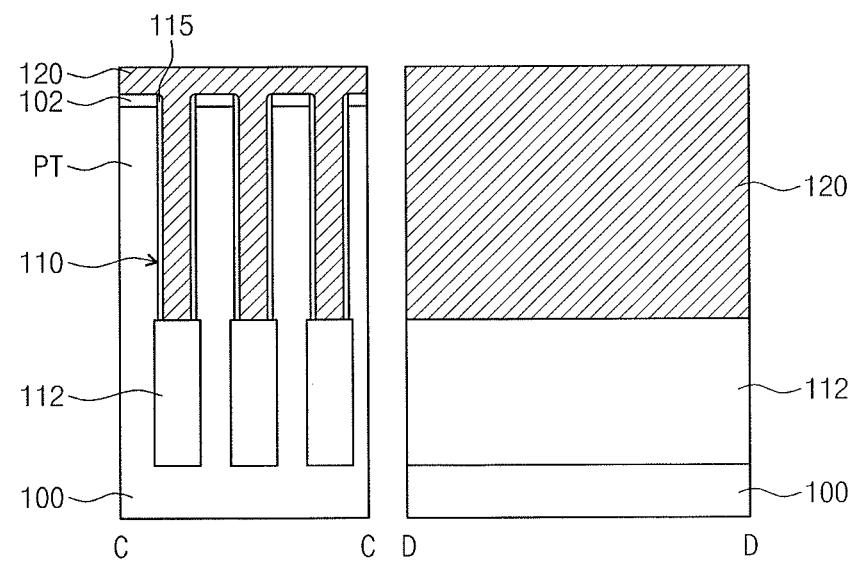

Referring to FIGS. 11A and 11B, the sacrificial spacers 107 may be removed after formation of the buried dielectric patterns 112. As a result, the upper inner sidewalls of the first trenches 110 may be exposed.

A gate dielectric layer 115 may be formed on the exposed inner sidewalls, e.g., the upper inner sidewalls, of the first trenches 110. The gate dielectric layer 115 may be formed using, e.g., a thermal oxidation technique. However, a method of forming the gate dielectric layer 115 is not limited to the thermal oxidation technique. For example, the gate dielectric layer 115 may be formed using a chemical vapor deposition (CVD) technique and/or an atomic layer deposition (ALD) technique. The gate dielectric layer 115 may be formed to have a single-layered structure or a multi-layered structure.

A gate conductive layer 120 may be formed on the resulting structure provided with the gate dielectric layer 115. For example, the gate conductive layer 120 may be formed to fill the first trenches 110 provided with the buried dielectric patterns 112 and may be formed on the fin patterns PT. In example embodiments, the gate conductive layer 120 may include a doped semiconductor layer.

For example, the gate conductive layer 120 may be formed of a doped silicon layer, a doped germanium layer, and/or a doped silicon-germanium layer. However, the gate conductive layer 120 may not be limited to those enumerated above, e.g., the gate conductive layer 120 may include at least one selected from a group of a doped semiconductor layer (e.g., doped silicon, doped germanium, doped silicon-germanium or the like), a conductive metal nitride layer (e.g., a titanium nitride layer, a tantalum nitride layer or the like), a transition metal layer (e.g., a titanium layer, a tantalum layer or the like), and a metal layer (e.g., a tungsten layer or the like).

Figure 12A:
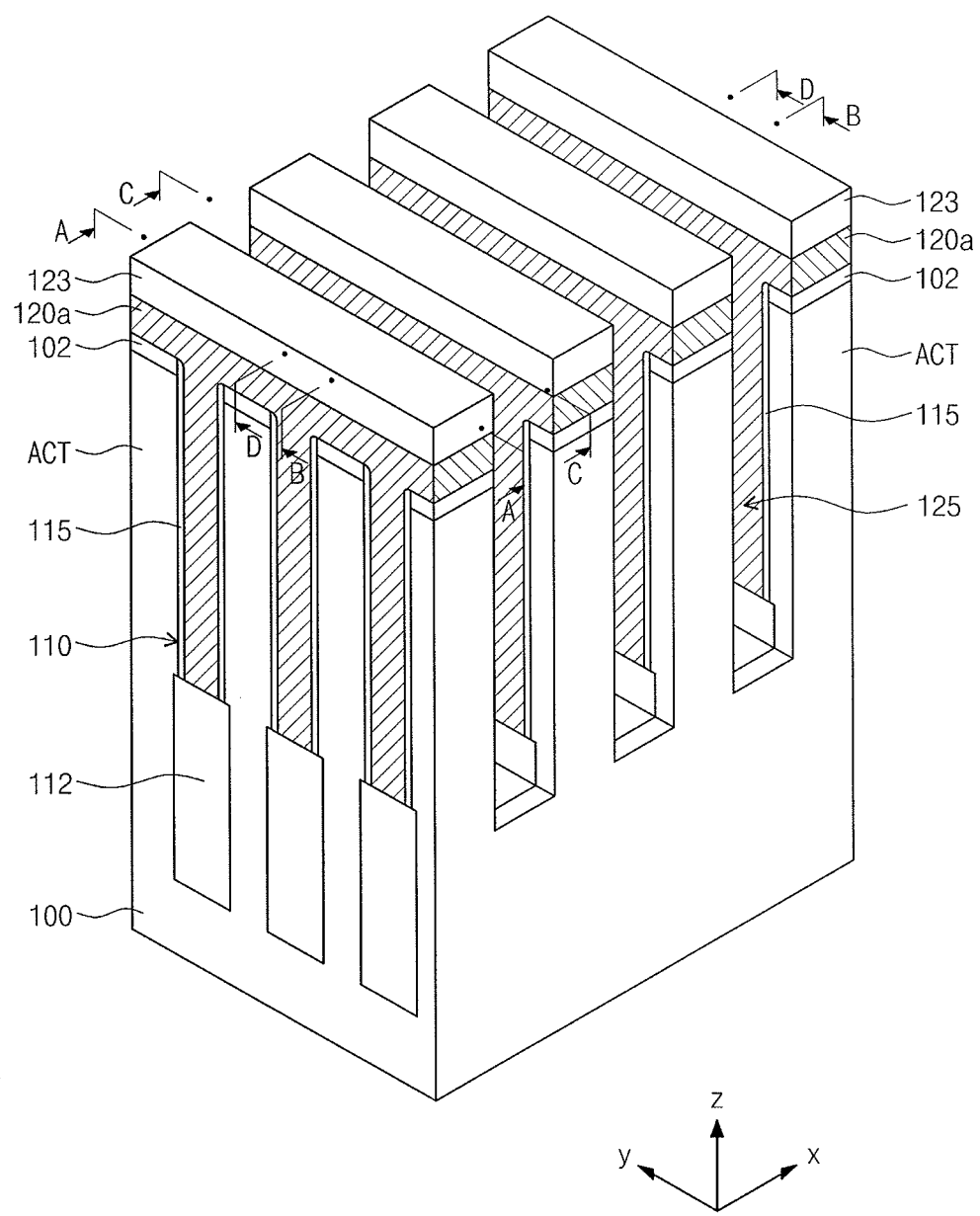
Figure 12B:
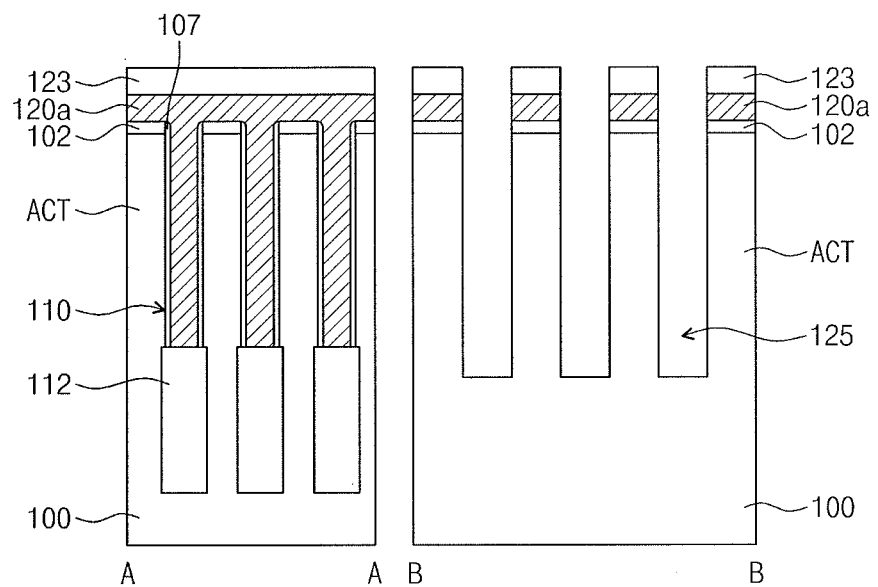
Figure 12B:
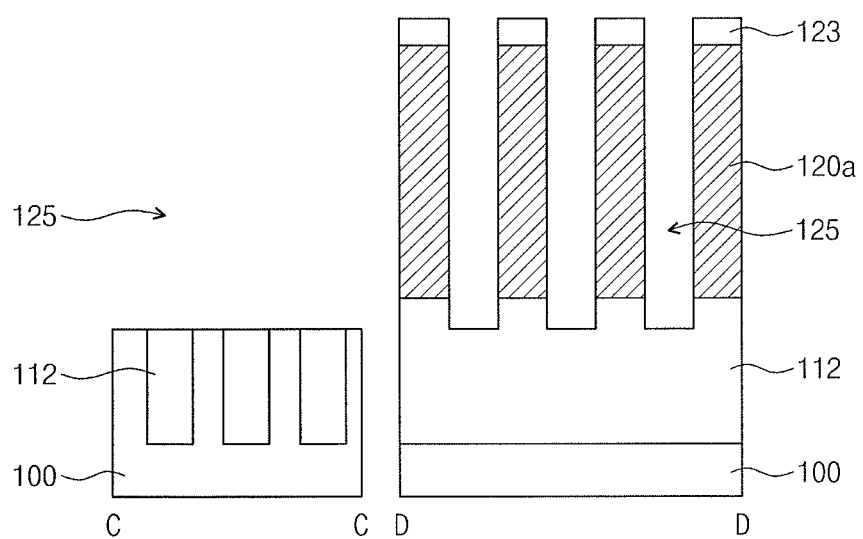

Referring to FIGS. 12A and 12B, a capping dielectric layer may be formed on the gate conductive layer 120. The capping dielectric layer may be a single-layered structure or a multi-layered structure. For example, the capping dielectric layer may include an oxide layer, a nitride layer and/or an oxynitride layer.

The capping dielectric layer, the gate conductive layer 120, the gate dielectric, the fin patterns PT, and the buried dielectric patterns 112 may be patterned to form second trenches 125. The second trenches 125 may be formed to cross the first trenches 110. For example, the second trenches 125 may be formed parallel to the second direction. As the result of the formation of the second trenches 125, a plurality of active pillars ACT may be formed, e.g., the active pillars ACT may divide the first trenches into separated portions 110 along the first direction. Each of the active pillars ACT may correspond to a portion of each fin pattern PT. The active pillars ACT may protrude upward from the substrate 100. In example embodiments, each of the active pillars ACT may be shaped like a square pillar having four sidewalls. The active pillars ACT may be two dimensionally arranged along rows and columns in a plan view. The active pillars ACT may be doped with dopants of a first conductivity type.

Preliminary gate patterns 120a may be formed as the result of the formation of the second trenches 125. Further, capping dielectric patterns 123 may be formed on the preliminary gate patterns 120a, respectively. The preliminary gate patterns 120a may correspond to portions of the gate conductive layer 120, which may be spaced apart from each other by the second trenches 125. Accordingly, each of the preliminary gate patterns 120a may extend, e.g., may be elongated in a direction, parallel to the second trenches 125. Each of the preliminary gate patterns 120a may include a plurality of portions filling the first trenches 110.

A bottom surface of the respective second trenches 125 may include first portions defined by the substrate 100 and second portions defined by the buried dielectric patterns 112. In example embodiments, the first and second portions of the bottom surface of the respective second trenches 125 may be located at a lower level than bottom surfaces of the preliminary gate patterns 120a in the first trenches 110. In example embodiments, the first and second portions of the bottom surface of the respective second trenches 125 may be higher than bottom surfaces of the buried dielectric patterns 112. The preliminary gate patterns 120a and the second trenches 125 may be alternatingly arranged along the first direction. The capping dielectric patterns 123 may correspond to portions of the capping dielectric layer.

Figure 13A:
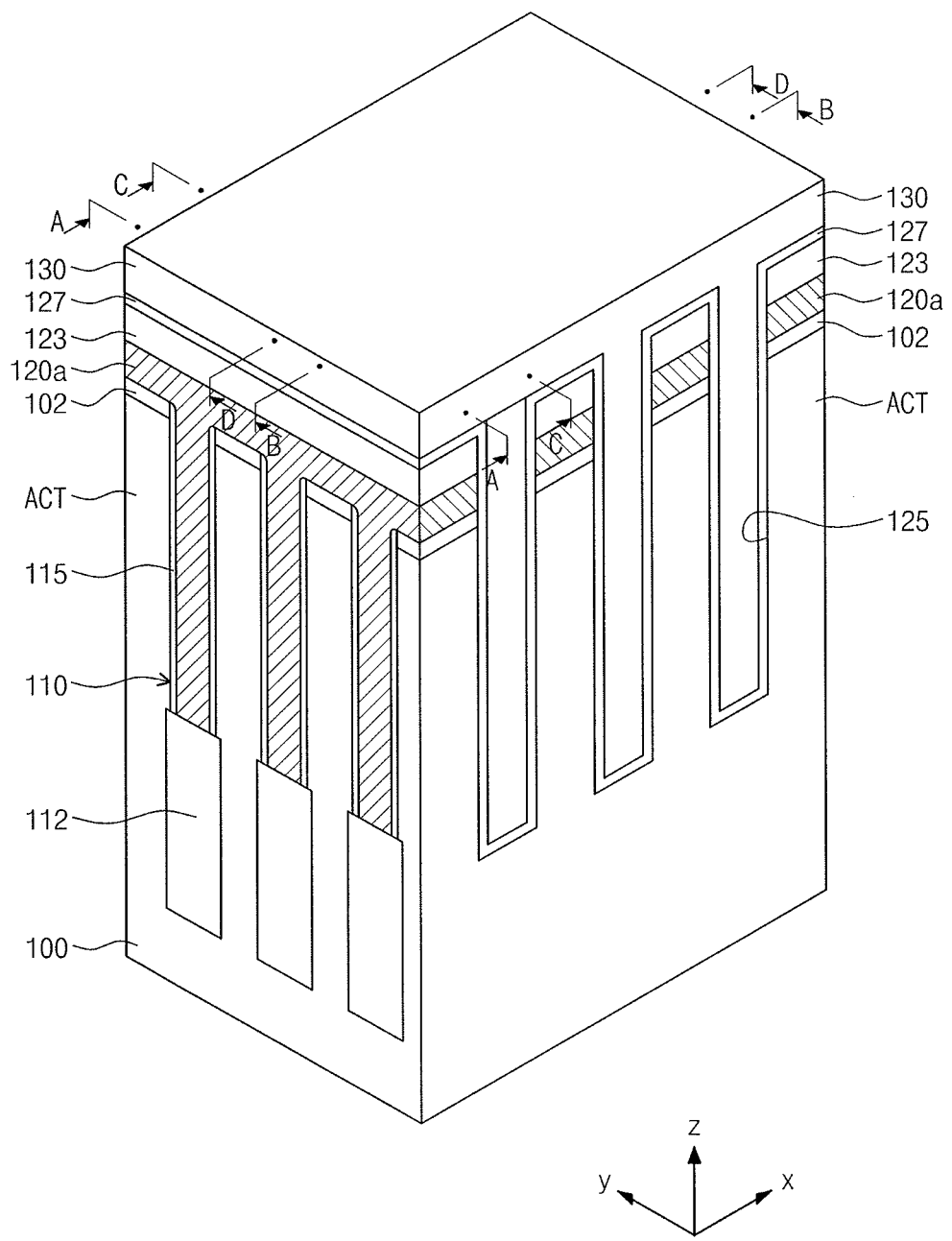
Figure 13B:
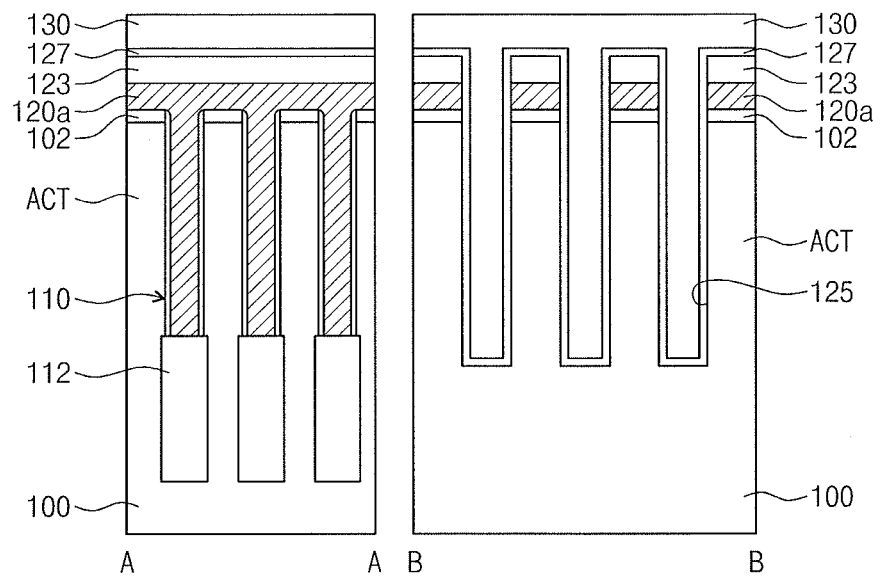
Figure 13B:
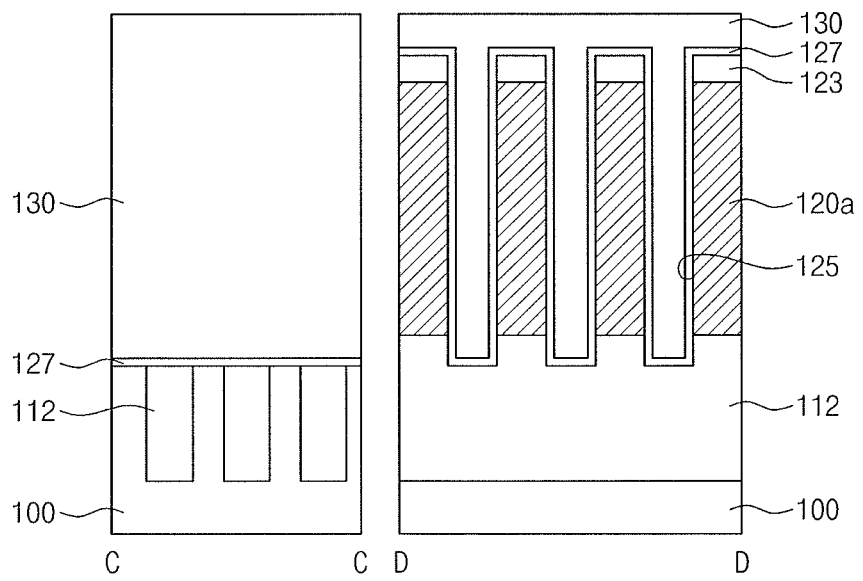

Referring to FIGS. 13A and 13B, an oxidation preventing layer 127 may be conformally formed on the resulting structure provided with the second trenches 125. For example, the oxidation preventing layer 127 may be formed to a substantially uniform thickness on inner surfaces of the second trenches 125 and on the capping dielectric patterns 123. The oxidation preventing layer 127 may be formed to have a single-layered structure or a multi-layered structure. For example, the oxidation preventing layer 127 may be formed of an oxide layer, a nitride layer, and/or an oxynitride layer. In example embodiments, the oxidation preventing layer 127 may include an oxide layer formed using an oxidation process and a nitride layer formed using a deposition process, which are sequentially stacked.

A mask layer 130 may be formed on the oxidation preventing layer 127 to fill the second trenches 125. For example, the mask layer 130 may include a spin on hard mask (SOH) layer. However, the mask layer 130 may not be limited to the SOH layer, e.g., the mask layer 130 may include at least one different layer from the SOH layer. Accordingly, the second trenches 125 may be filled, e.g., completely filled, with the oxidation preventing layer 127 and the mask layer 130.

Figure 14A:
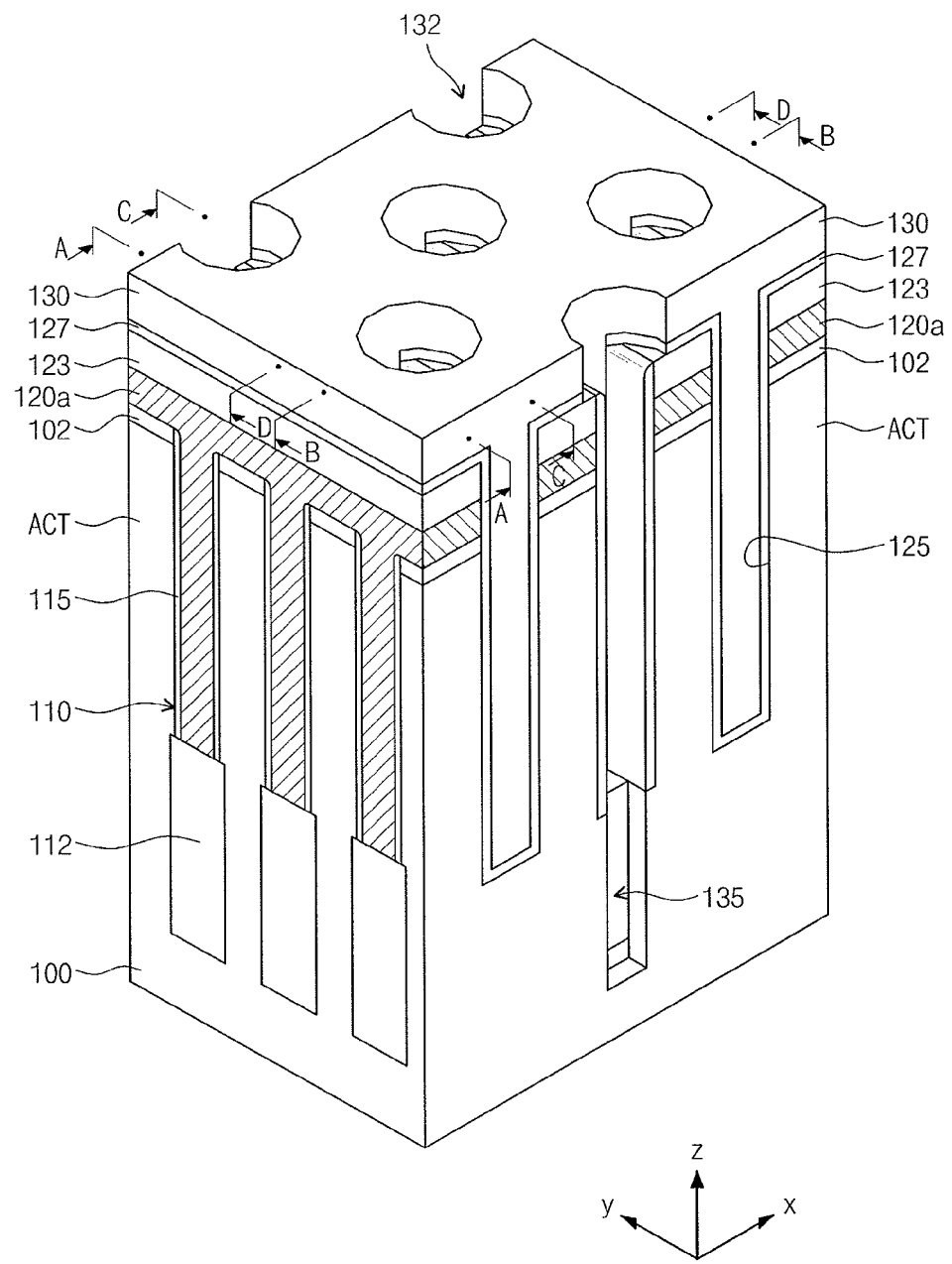
Figure 14B:
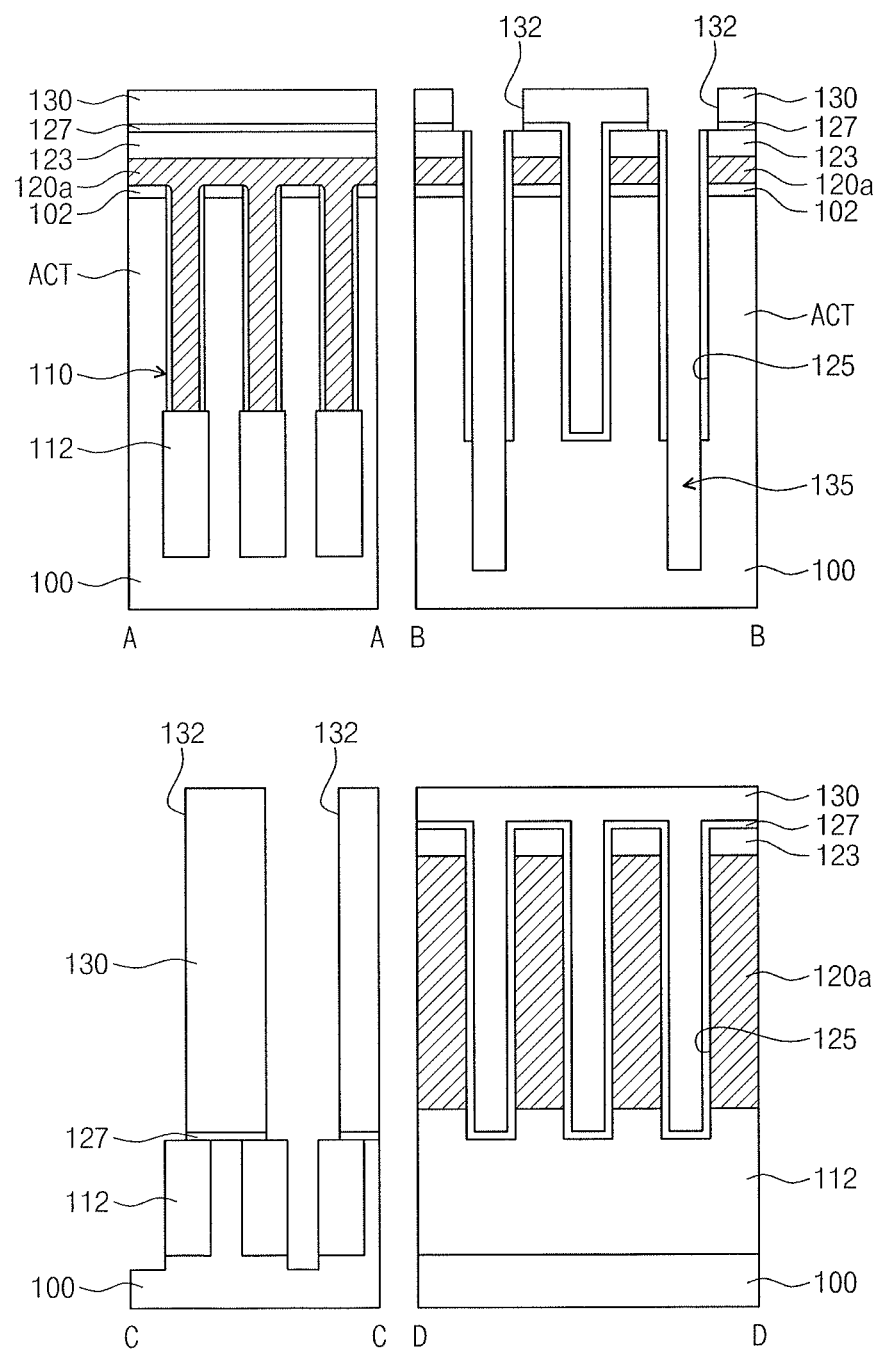

Referring to FIGS. 14A and 14B, the mask layer 130 may be patterned to form openings 132. The openings 132 may expose portions of the oxidation preventing layer 127 located on the bottom surfaces of the second trenches 125, respectively. A width of the respective openings 132 may be greater than that of the respective second trenches 125, when measured along the first direction.

As mentioned above, the bottom surface of the respective second trenches 125 may include the first portions defined by the substrate 100 and the second portions defined by the buried dielectric patterns 112. The first and second portions of the bottom surface of the respective second trenches 125 may be alternatingly formed along the second direction.

The openings 132 may be formed on selected ones of the first portions of the second trenches 125. In example embodiments, the selected first portions may include odd-numbered ones of the first portions that are provided in one of an adjacent pair of the second trenches 125 and even-numbered ones of the first portions that are provided in the other of the adjacent pair of the second trenches 125. For example, more than one of the openings 132 may be formed along each of the second trenches 125, and openings 132 formed along adjacent second trenches 125 may be distanced from each other by a staggered relationship with respect to the arrangement of the first trenches 110. As a result, on the adjacent pair of the second trenches 125, the openings 132 may be formed to have a zigzag arrangement along the second direction. The first portions, which are not located below the openings 132, may be covered with the oxidation preventing layer 127.

The oxidation preventing layer 127 exposed by the openings 132, e.g., portions of the oxidation preventing layer 127 on the bottom surface of the second trenches 125, may be etched to expose the selected first portions of the bottom surfaces of the second trenches 125. In example embodiments, the oxidation preventing layer 127 may remain on the inner sidewalls of the second trenches 125, which may be exposed by the openings 132. The exposed first portions may be etched using the mask layer 130 as an etching mask to form recessed regions 135 that extend below the oxidation preventing layer 127. The recess regions 135 may extend further below the substrate 100 than the buried dielectric patterns 112.

Figure 15A:
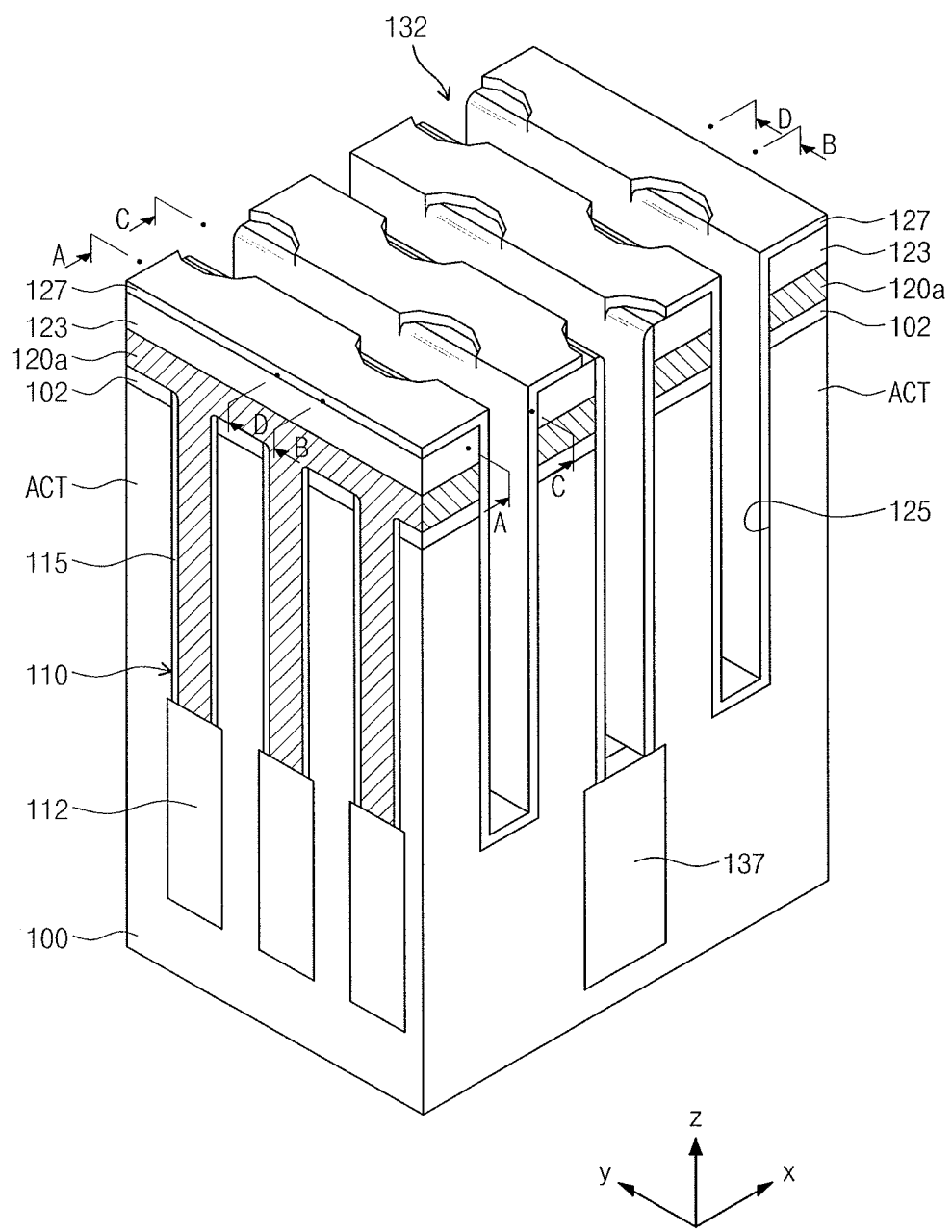
Figure 15B:
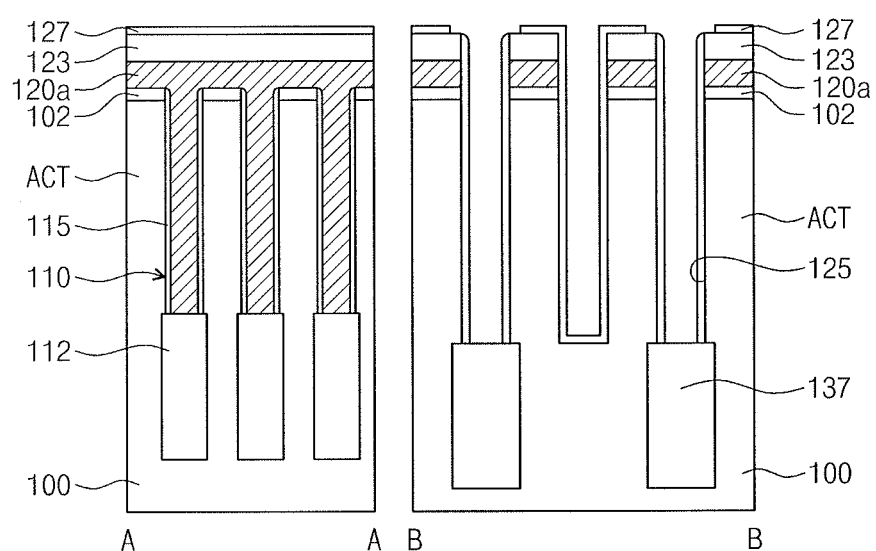
Figure 15B:
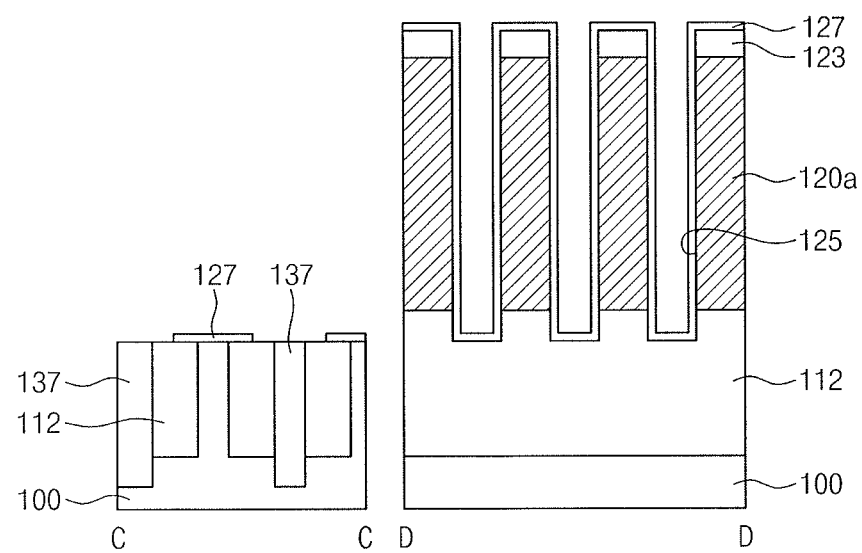

Referring to FIGS. 15A and 15B, the remaining portions of mask layer 130 may be removed after formation of the recessed regions 135. A plurality of plug dielectric patterns 137 may be formed in the recessed regions 135, respectively. The plug dielectric patterns 137 may be formed to fill the recessed regions 135. For example, the formation of the plug dielectric patterns 137 may include a second oxidation process to be performed to the substrate exposed by the recessed regions 135. During the second oxidation process, the substrate 100 covered with the oxidation preventing layer 127 and the hard mask patterns 102 may not be oxidized.

That is, the active pillars ACT may not be oxidized due to the presence of the oxidation preventing layer 127 during the second oxidation process. In the case where the plug dielectric patterns 137 is formed using the second oxidation process, the plug dielectric patterns 137 may be laterally grown. For example, a width of the plug dielectric patterns 137 may be greater than that of the recessed regions 135, when measured along the first direction. Referring to FIG. 15B, the plug dielectric patterns 137 may be formed to abut the buried dielectric patterns 112 in the second direction. In example embodiments, the plug dielectric pattern 137 may be formed to have a width greater than that of an upper region of the second trench 125. For example, a bottom surface of the second trenches 125 may be defined by the buried dielectric patterns 112, the plug dielectric patterns 137, and portions of the substrate 100 covered by the oxidation preventing layer 127.

Figure 16A:
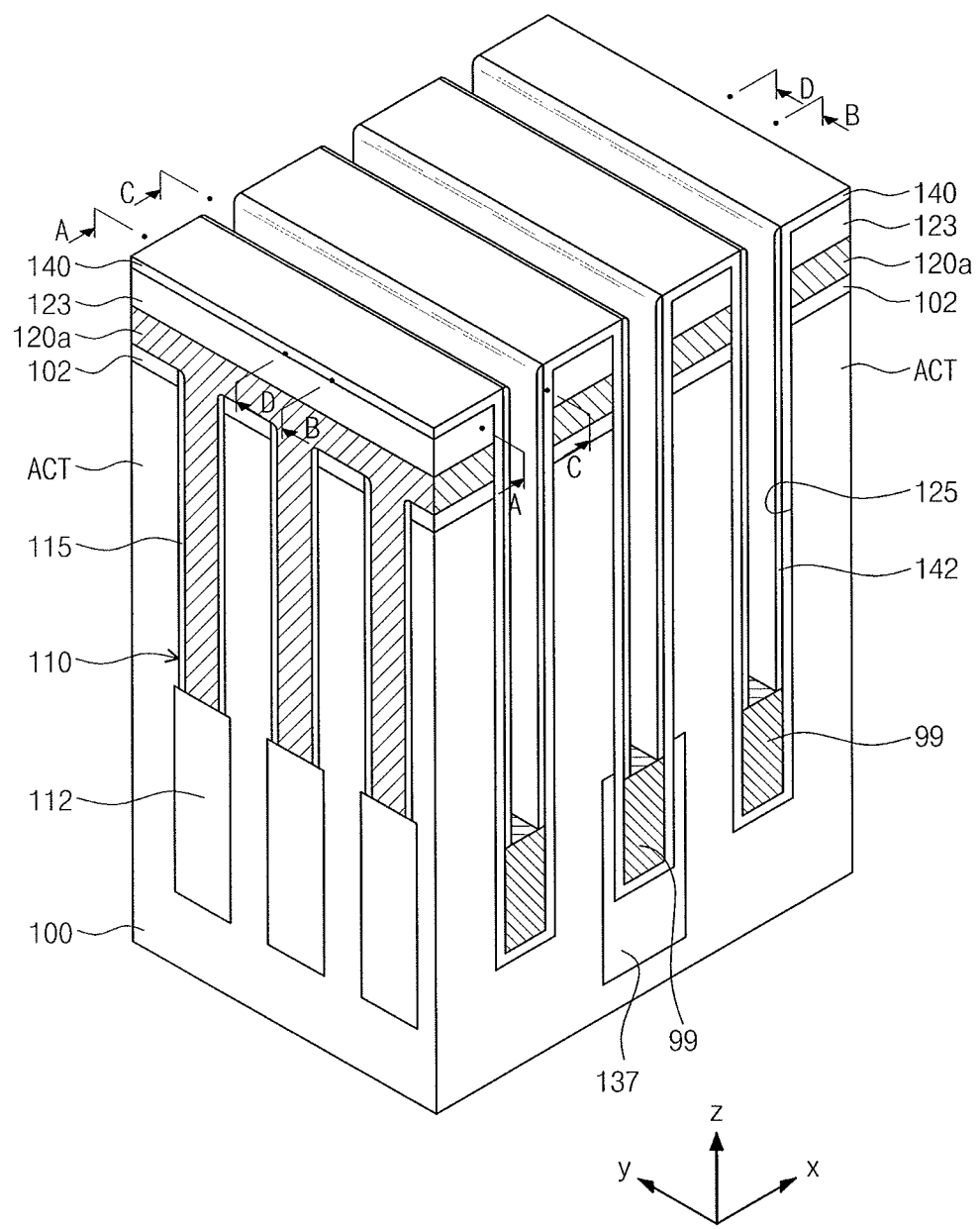
Figure 16B:
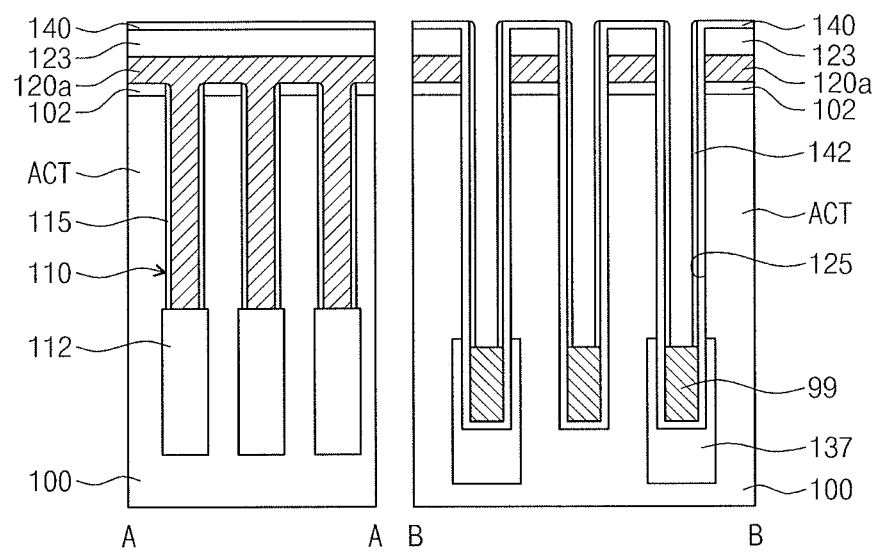
Figure 16B:
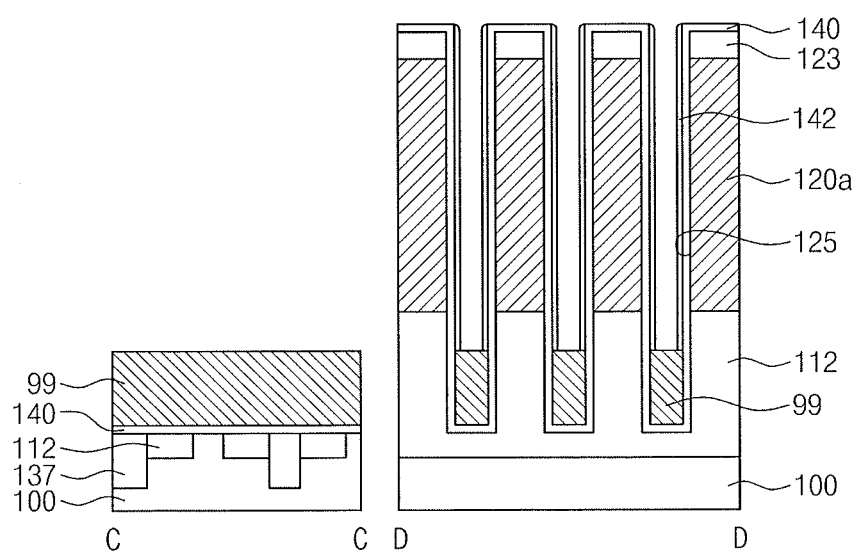

Referring to FIGS. 16A and 16B, an etching process may be performed to recess top surfaces of the substrate 100 and the plug dielectric pattern 137 that are exposed by the second trench 125. Accordingly, the second trench 125 may be formed to have a bottom surface lower than that of the preliminary gate pattern 120a. Thereafter, a window insulating layer 140 may be formed to cover, e.g., conformally cover, an inner surface of the second trench 125. Then, a sacrificial pattern 99 may be locally formed at a lower region of the second trench 125.

In example embodiments, before the formation of the window insulating layer 140, the oxidation preventing layer 127 may be removed to expose the inner surface of the second trench 125. In this case, as shown, the window insulating layer 140 may be formed to be in direct contact with the inner surface of the second trench 125.

The formation of the sacrificial pattern 99 may include forming a sacrificial layer to fill the second trench 125 provided with the window insulating layer 140, removing the sacrificial layer from an upper region of the second trench 125, and then, forming a sidewall spacer 142 on a sidewall of the second trench 125.

Figure 17A:
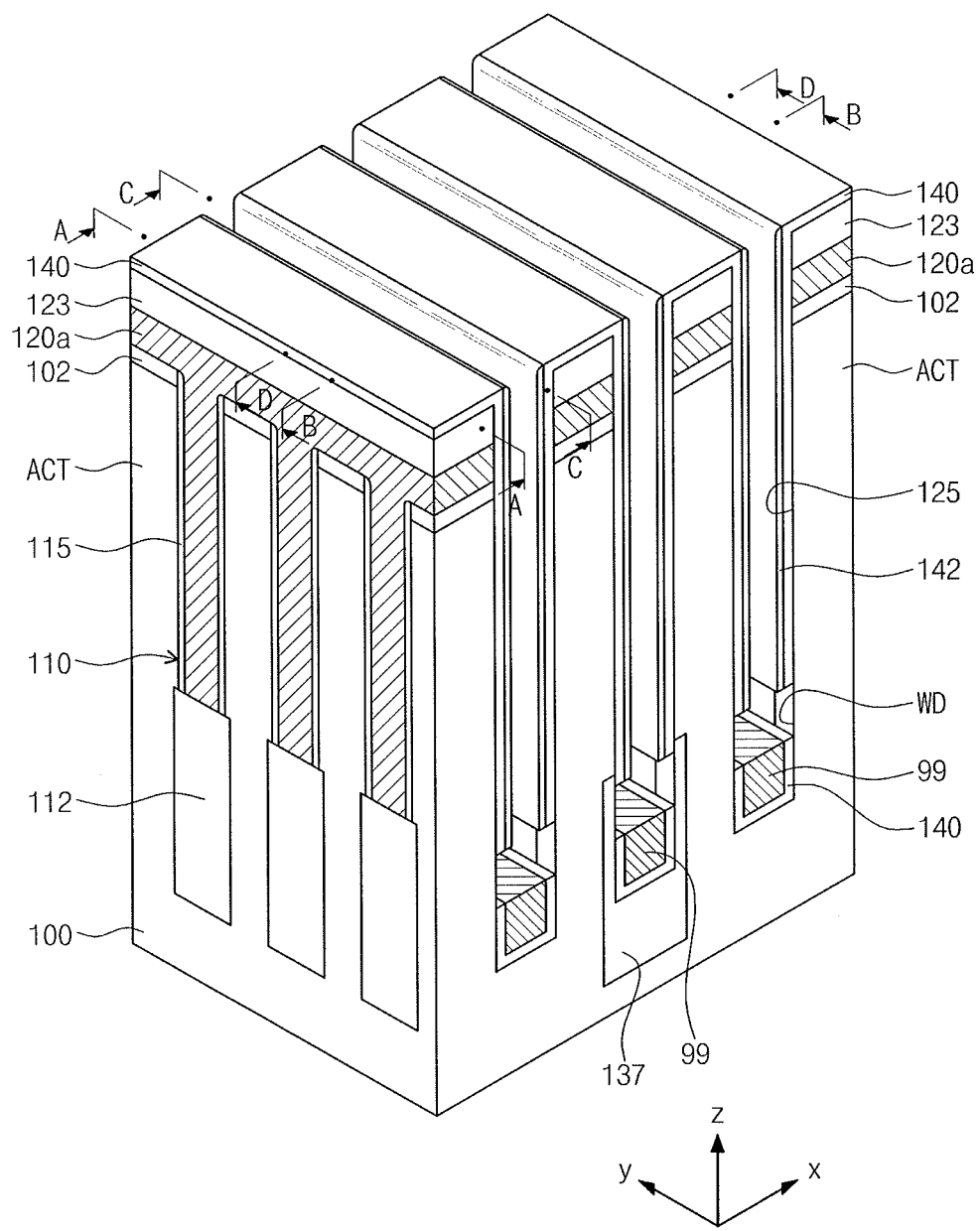
Figure 17B:
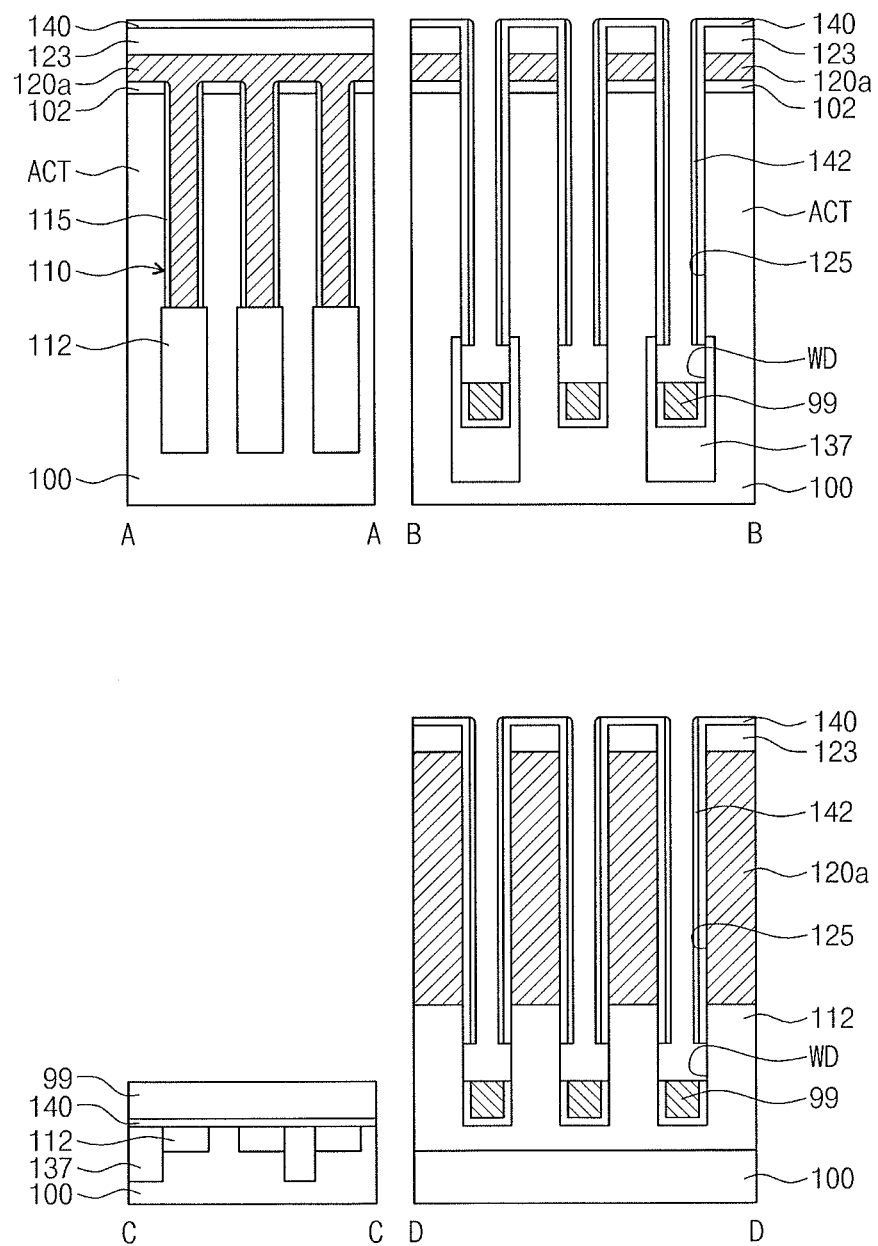

Referring to FIGS. 17A and 17B, the top surface of the sacrificial pattern 99 may be recessed using the sidewall spacer 142 as an etch mask. Accordingly, the sacrificial pattern 99 may be formed to have a top surface spaced apart from the sidewall spacer 142, and the window insulating layer 140 may be formed to have an inner surface exposed between the sidewall spacer 142 and the sacrificial pattern 99.

Thereafter, the exposed inner surface of the window insulating layer 140 may be etched using the sidewall spacer 142 and the sacrificial pattern 99 as an etch mask. Accordingly, a window WD may be formed to expose sidewalls of the active pillar ACT and the plug dielectric pattern 137. The window WD may be formed using the fabrication method described with reference to FIG. 2.

Figure 18A:
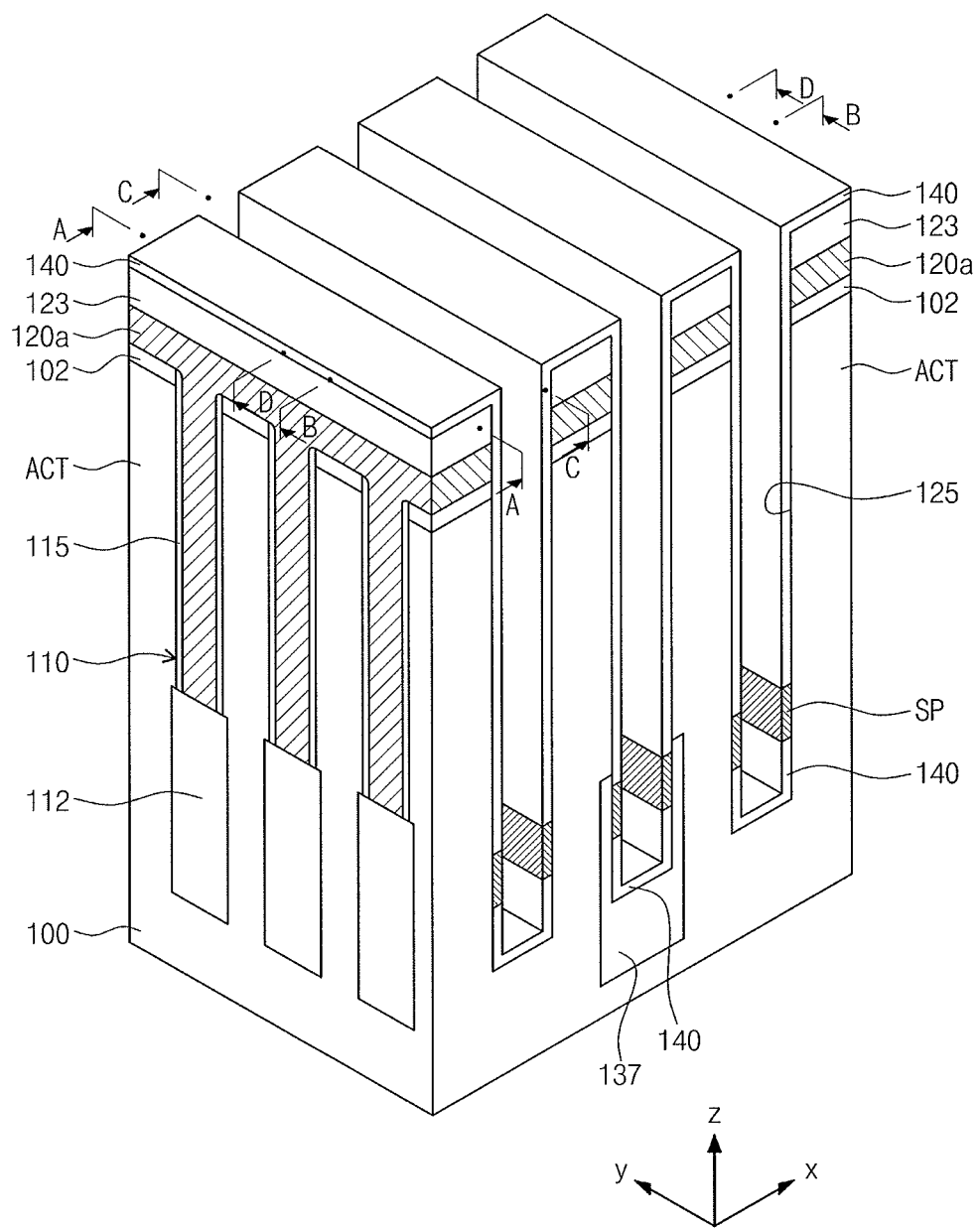
Figure 18B:
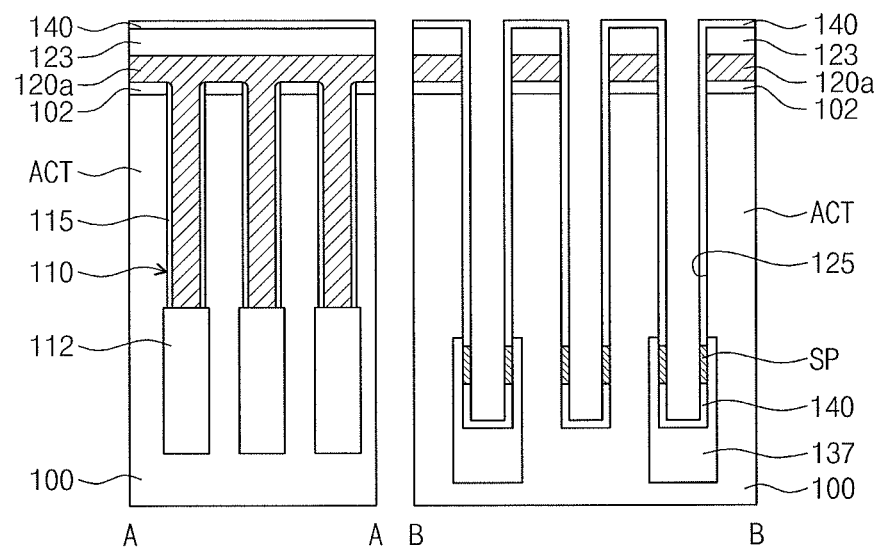
Figure 18B:
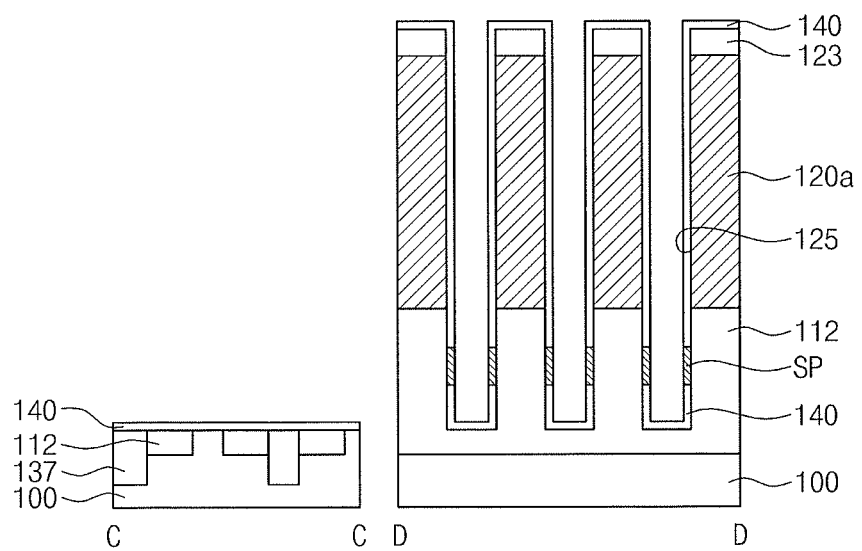

Referring to FIGS. 18A and 18B, semiconductor patterns SP may be formed to be localized within the window WD. The semiconductor patterns SP may be formed using the fabrication method described with reference to FIGS. 3 and 4. As a result, each of the semiconductor patterns SP may be smaller than the second trench 125 provided with the window insulating layer 140, in terms of both of vertical and horizontal widths. Furthermore, the semiconductor patterns SP may have bottom surfaces, which are spaced apart from a bottom of the second trench 125.

The semiconductor patterns SP may be formed parallel to the second trenches 125. Furthermore, the semiconductor patterns SP may be in direct contact with or be spatially separated from the active pillar ACT, according to the presence or absence of the plug dielectric pattern 137. For example, the plug dielectric pattern 137 may be interposed between the active pillar ACT and the semiconductor pattern SP to serve as a device isolation layer that electrically separates them from each other. For example, the plug dielectric pattern 137 may cover, e.g., an entirety of, a portion of the semiconductor pattern SP that faces the active pillar ACT.

Figure 19A:
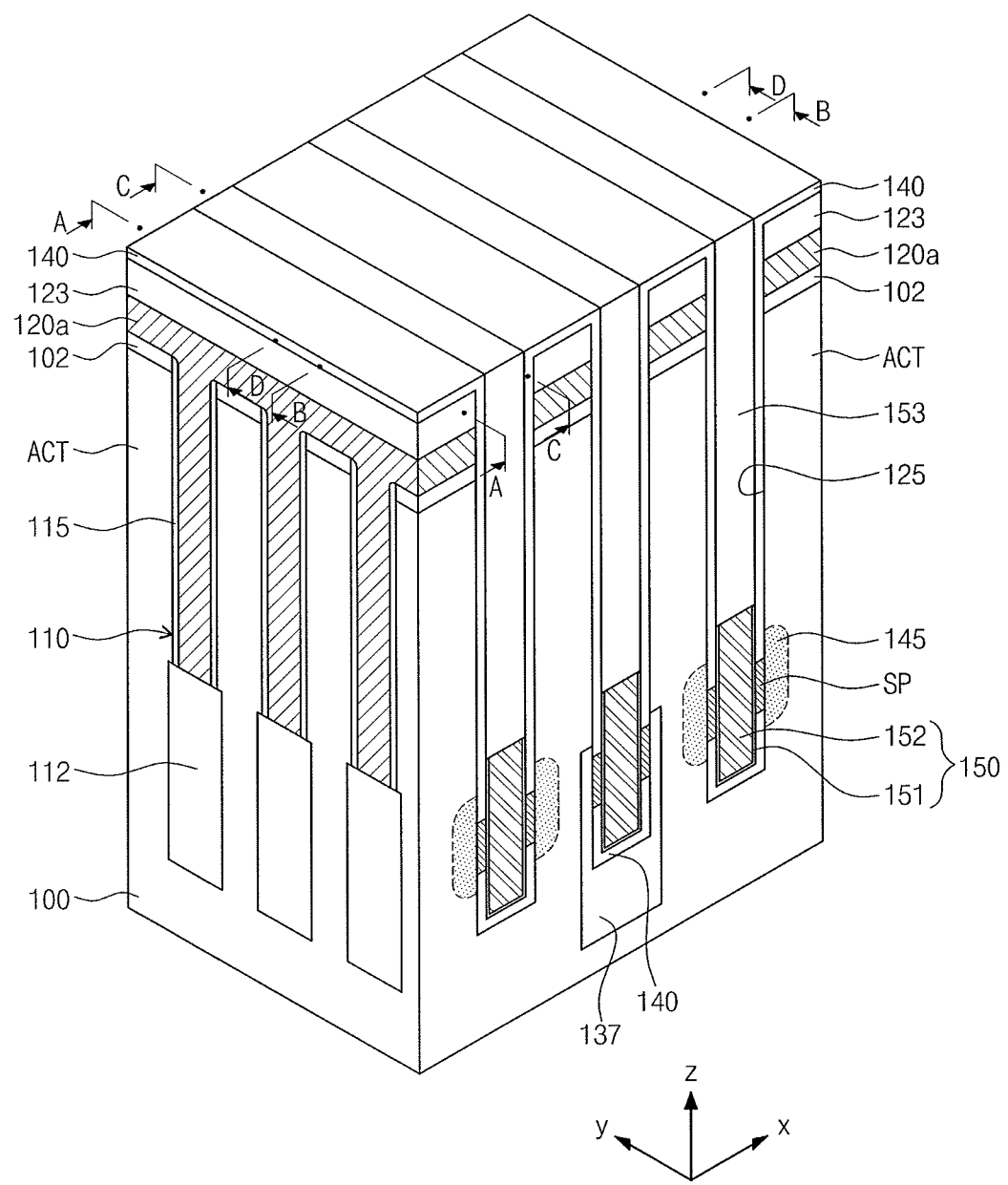
Figure 19B:
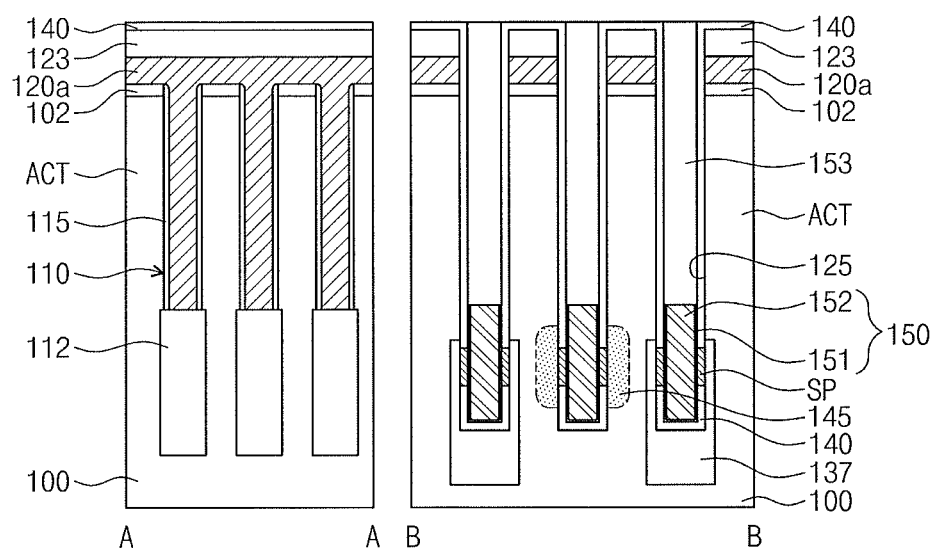
Figure 19B:
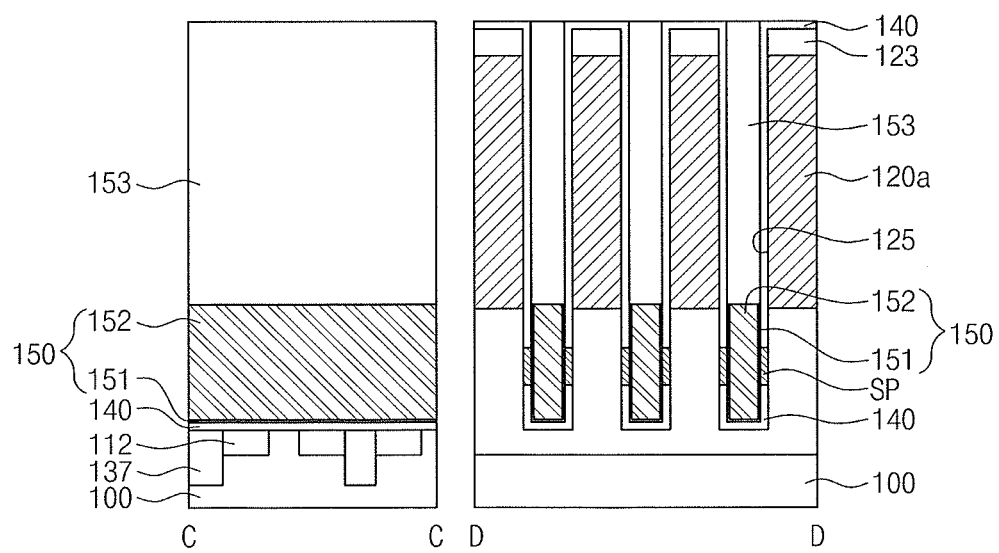
Figure 20A:
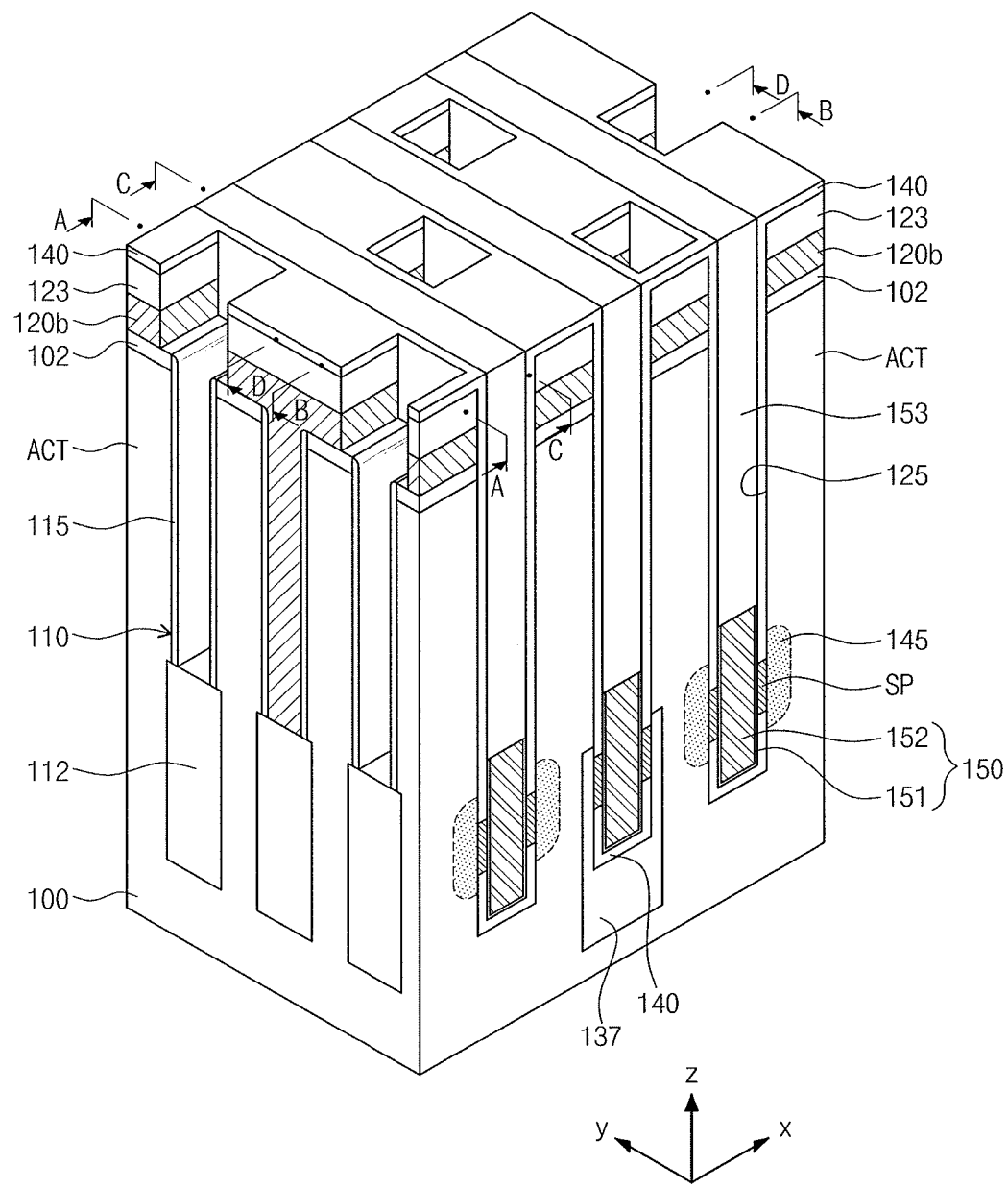
Figure 20B:
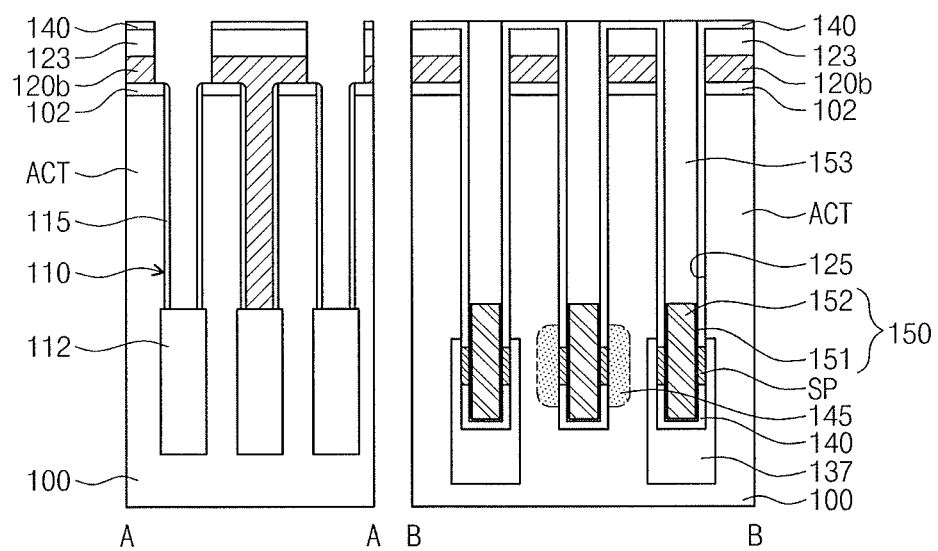
Figure 20B:
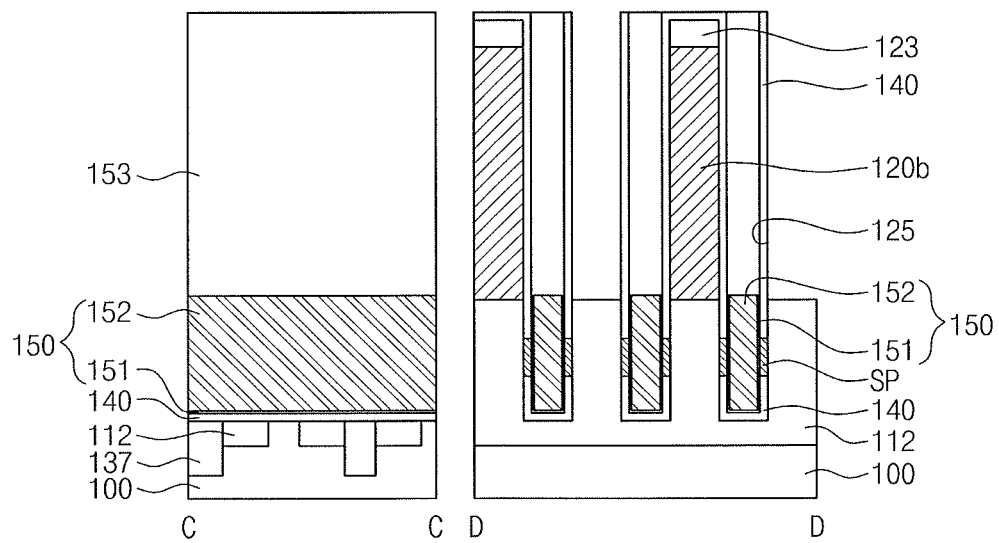
Figure 21A:
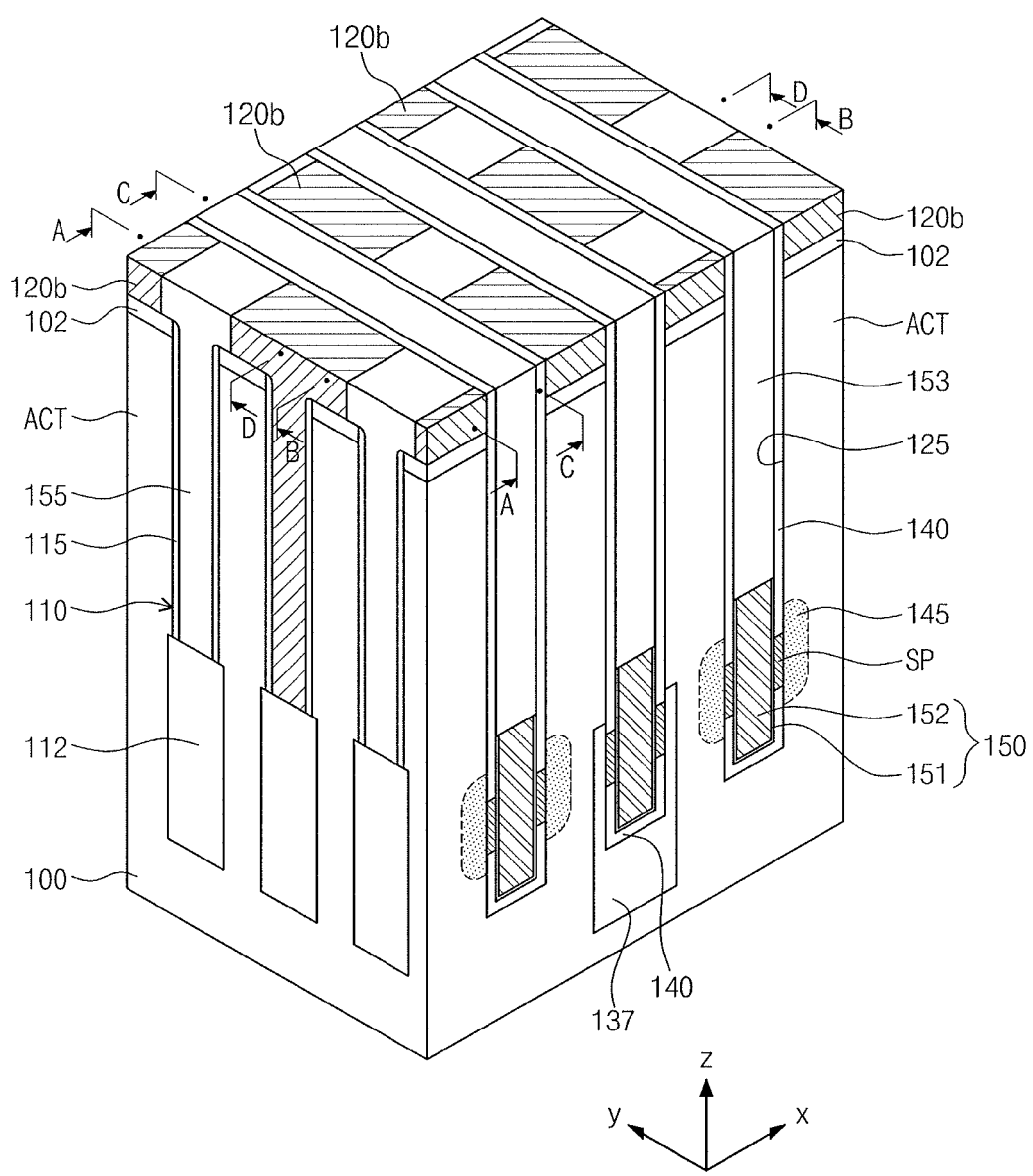
Figure 21B:
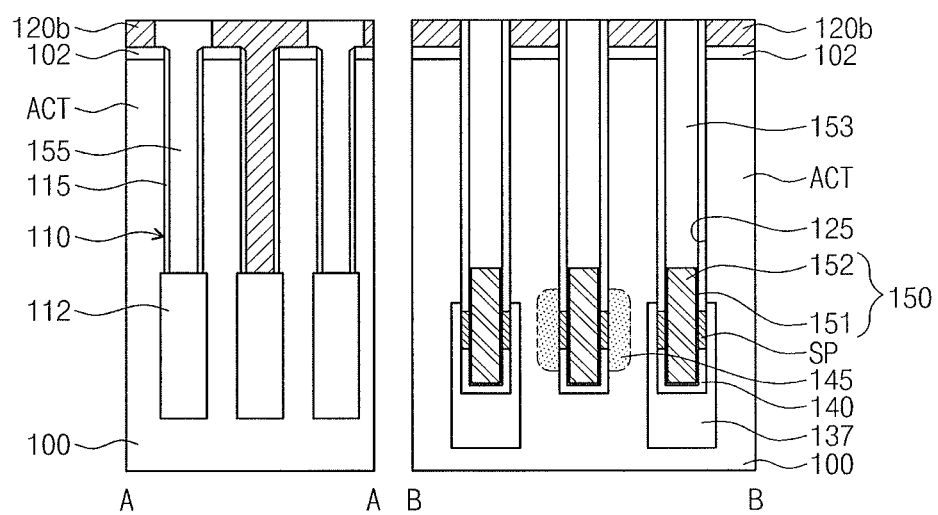
Figure 21B:
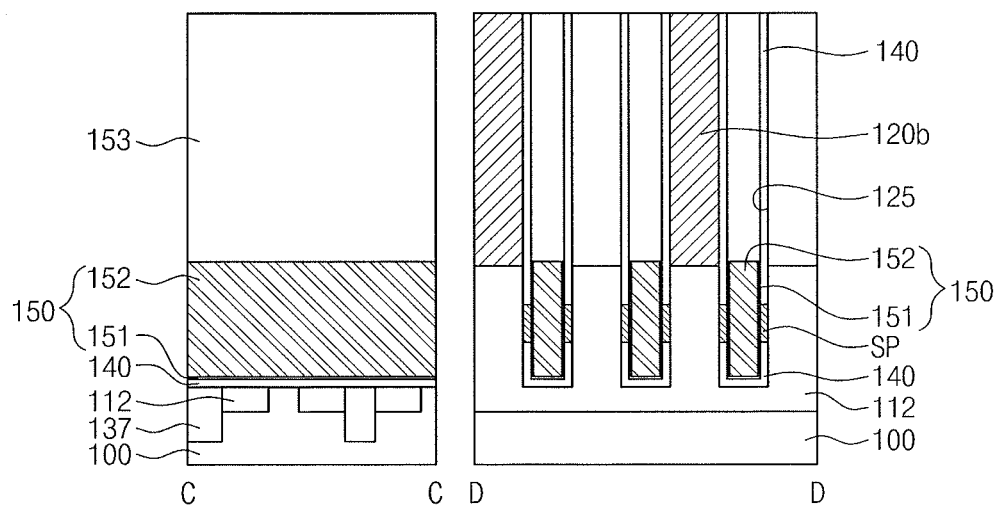

Referring to FIGS. 19A and 19B, the semiconductor patterns SP may be doped with impurities, and then, a diffusion process may be performed to form lower doped regions 145 in the active pillar ACT adjacent to the window WD. In example embodiments, each of the lower doped regions 145 may be formed to have a width smaller than the active pillar ACT. Accordingly, the active pillar ACT may be electrically connected to the substrate 100, thereby being in an equipotential state with the substrate 100. Furthermore, since the window WD is formed at a lever higher than the bottom of the second trench 125, the lower doped regions 145 may not be formed below the second trench 125. For example, the bottom surfaces of the lower doped regions 145 may be spaced apart from the bottom surface of the second trench 125.

Thereafter, buried wirings 150 may be formed in the lower regions of the second trenches 125. The buried wirings 150 may be electrically connected to the semiconductor patterns SP. In example embodiments, the buried wirings 150 may be formed using the fabrication method described with reference to FIGS. 5 and 6. For example, each of the buried wirings 150 may include a first buried wiring 151 and a second buried wiring 152.

Next, a first gap-filling dielectric 153 may be formed to fill the second trench 125 provided with the buried wirings 150.

The first gap-filling dielectric 153 may include at least one of an oxide layer, a nitride layer, or an oxynitride layer. In example embodiments, the first gap-filling dielectric 153 may be planarized by an etching process, thereby exposing a top surface of the window insulating layer 140.

Referring to FIGS. 20A, 20B, 21A, and 21B, the preliminary gate pattern 120a may be patterned to form gate patterns 120b. The formation of the gate patterns 120b may be performed to horizontally separate the preliminary gate pattern 120a into a plurality portions. For example, the horizontal separation may include removing the preliminary gate pattern 120a from some of the first trenches 110.

Thereafter, gap-fill dielectric patterns 155a may be formed to fill empty spaces, which may be formed by the removal of the preliminary gate pattern 120a. The gap-fill dielectric patterns 155a may include at least one of an oxide layer, a nitride layer, or an oxynitride layer.

Figure 22A:
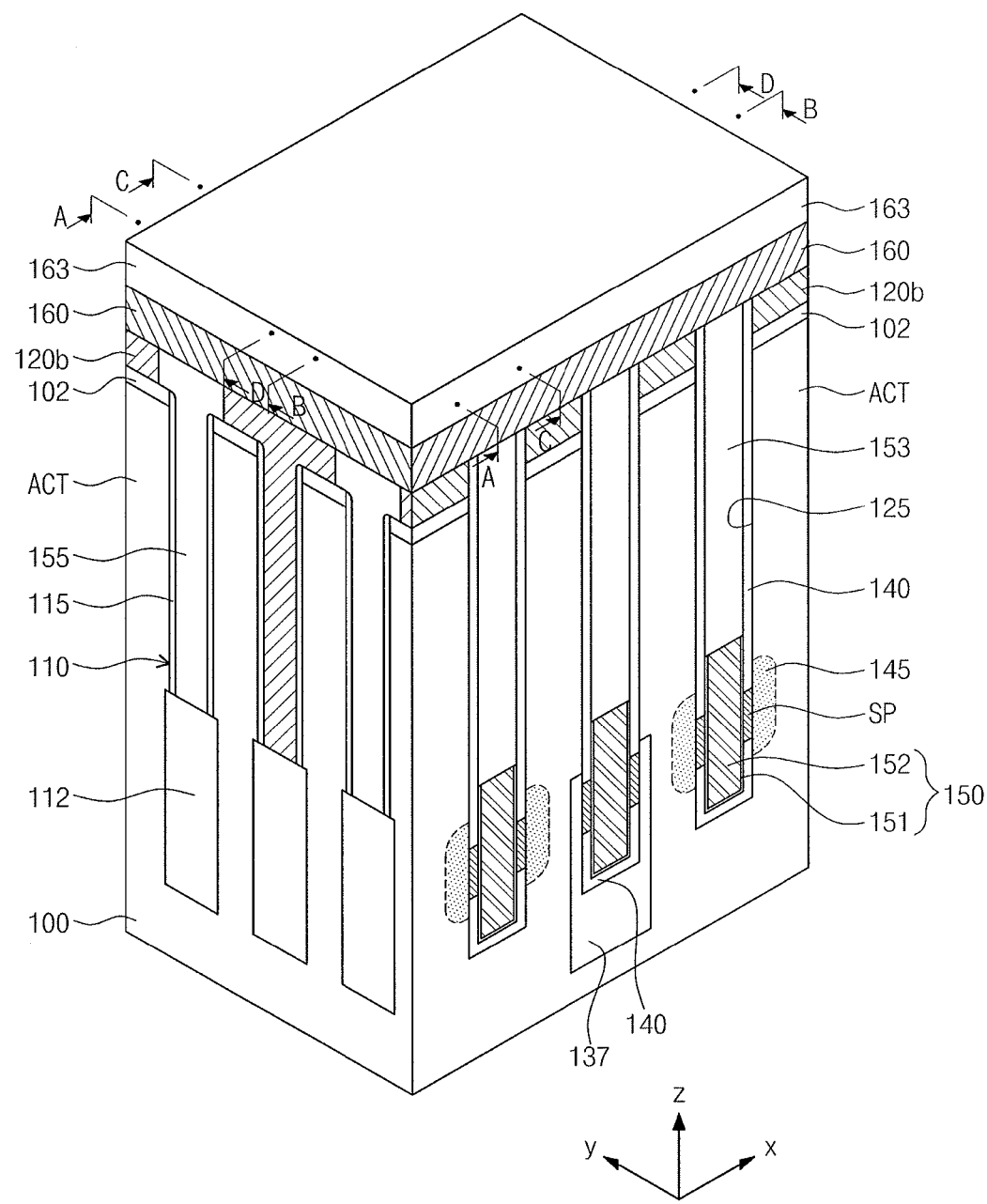
Figure 22B:
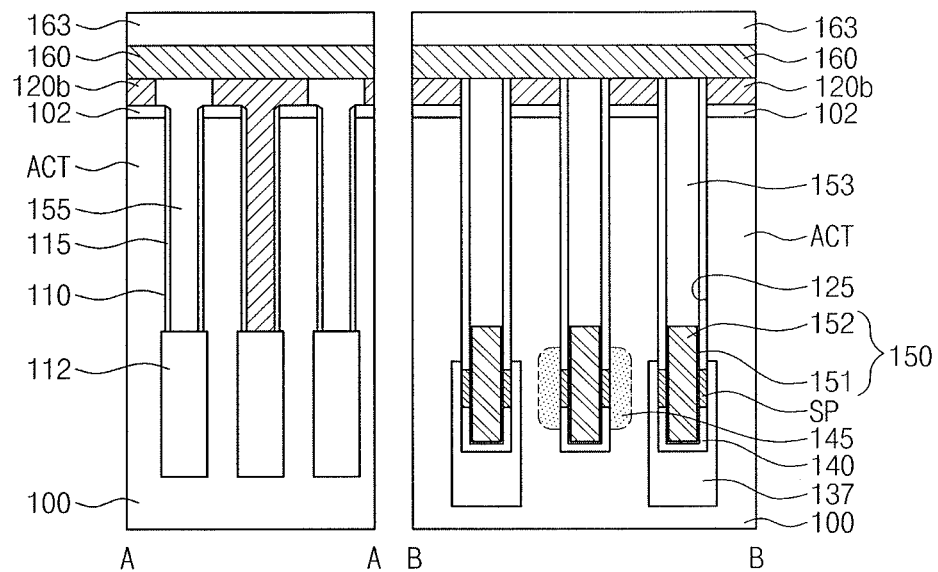
Figure 22B:
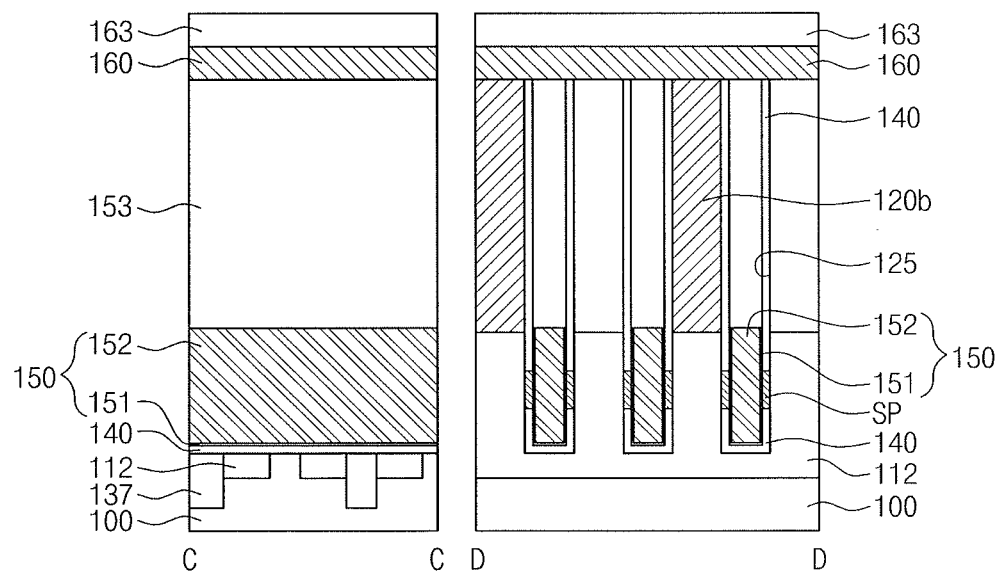

Referring to FIGS. 22A and 22B, an upper conductive layer 160 and a gate capping layer 163 may be sequentially formed on the resulting structure. The upper conductive layer 160 may be in contact with the gate patterns 120b. The upper conductive layer 160 may be formed to have a single-layered or multi-layered structure. The upper conductive layer 160 may include a conductive material having low resistivity. For example, the upper conductive layer 160 may include at least one selected from the group of a conductive metal nitride layer (e.g., a titanium nitride layer or a tantalum nitride layer), a transition metal layer (e.g., a titanium layer or a tantalum layer), a metal layer (e.g., a tungsten layer or an aluminum layer), and a metal-semiconductor compound layer (e.g., a metal silicide layer). In example embodiments, the upper conductive layer 160 may further include a doped semiconductor layer. The gate capping layer 163 may be formed to have a single-layered or multi-layered structure. For example, the gate capping layer 163 may be formed of an oxide layer, a nitride layer, or an oxynitride layer.

Figure 23A:
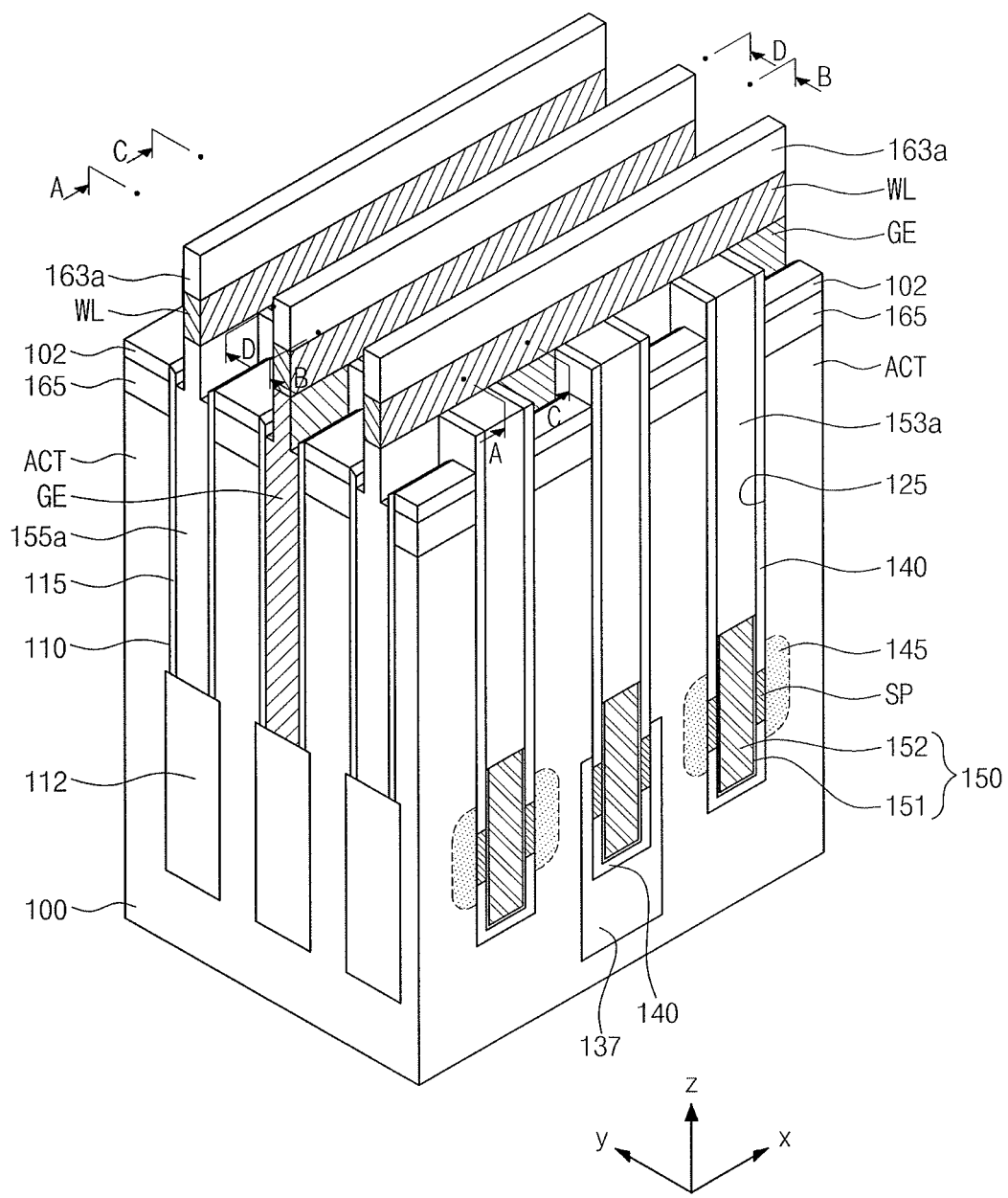
Figure 23B:
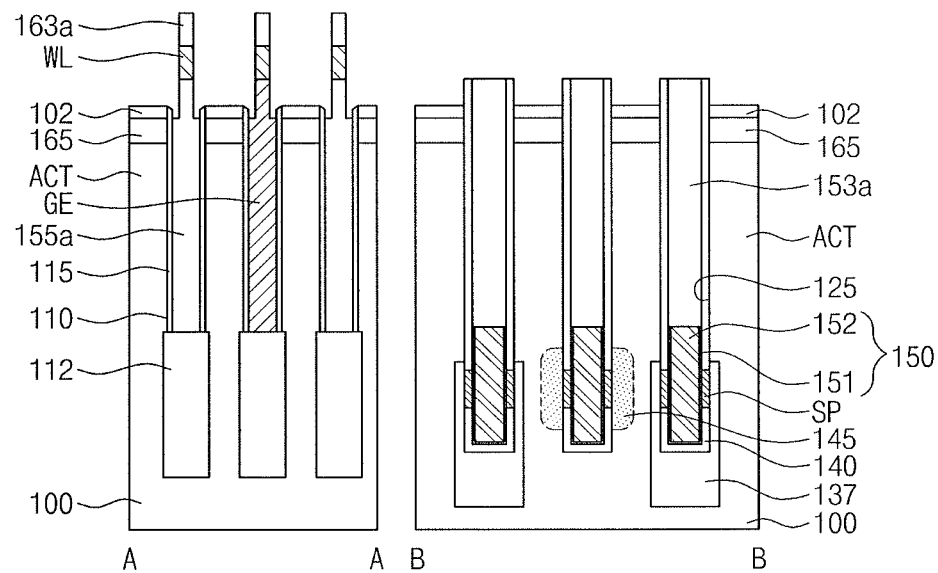
Figure 23B:
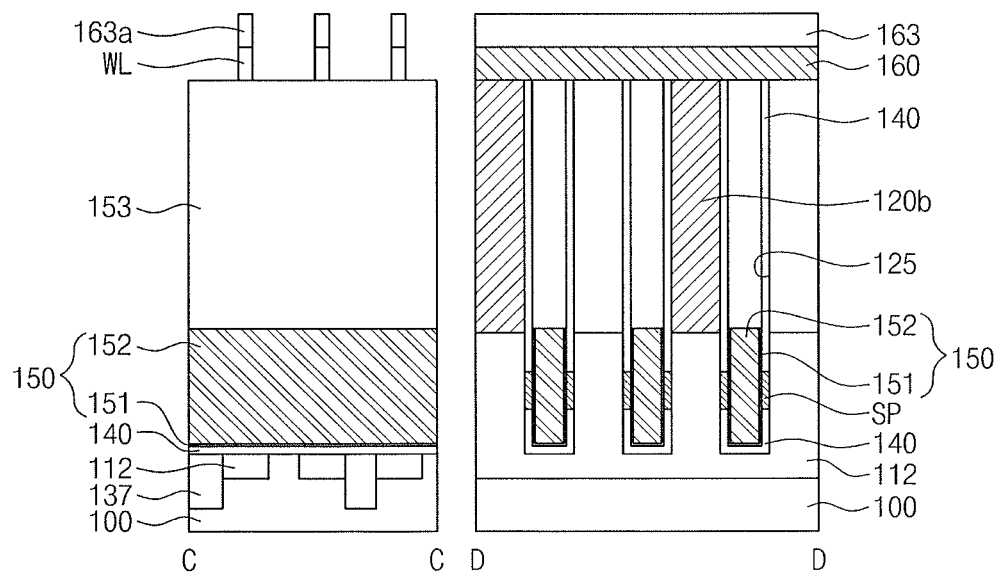

Referring to FIGS. 23A and 23B, the gate capping layer 163, the upper conductive layer 160 and the gate patterns 120b are patterned to form gate patterns extending in the first directions. Each of the gate patterns may include a gate electrode GE, a word line WL and gate capping pattern 163a, which are sequentially stacked. The word lines WL and the gate capping patterns 163a may extend parallel to the first direction. Each of the word lines WL may correspond to a portion of the upper conductive layer 160. While the upper conductive layer 160 and the gate patterns 120b are patterned, the gate patterns 120b may be removed from the top surfaces of the active pillars ACT, thereby forming the gate electrodes GE localized below the word line WL. Each of the gate electrodes GE may be disposed between the pair of adjacent active pillars ACT.

Dopants of the second conductivity type may be injected into upper portions of the active pillars ACT to form upper doped regions 165. The upper doped regions 165 may be locally formed in the upper portions of the active pillars ACT, respectively. The upper doped regions 165 may be vertically spaced apart from the lower doped regions 145. The active pillars ACT between the upper doped regions 165 and the lower doped regions 145 may serve as channel bodies of the vertical channel transistors according to example embodiments.

Each of the gate electrodes GE may correspond to the gates of the first and second vertical channel transistors FET1 and FET2 of each of the first and second transistor-pairs TRP1 and TRP2 illustrated in FIG. 7. In other words, each of the gate electrodes GE may serve as a common gate electrode shared by at least two of the vertical channel transistors. The lower dopant regions 145 may serve as the drain terminals of the first and second vertical channel transistors FET1 and FET2 of FIG. 7, and the upper dopant regions 165 may serve as the source terminals of the first and second vertical channel transistors FET1 and FET2 of FIG. 7. The word lines WL may serve as the word lines WL1 and WL2 of FIG. 7, and the buried interconnections 150 may serve as the buried wirings BW1 and BW2.

Figure 24A:
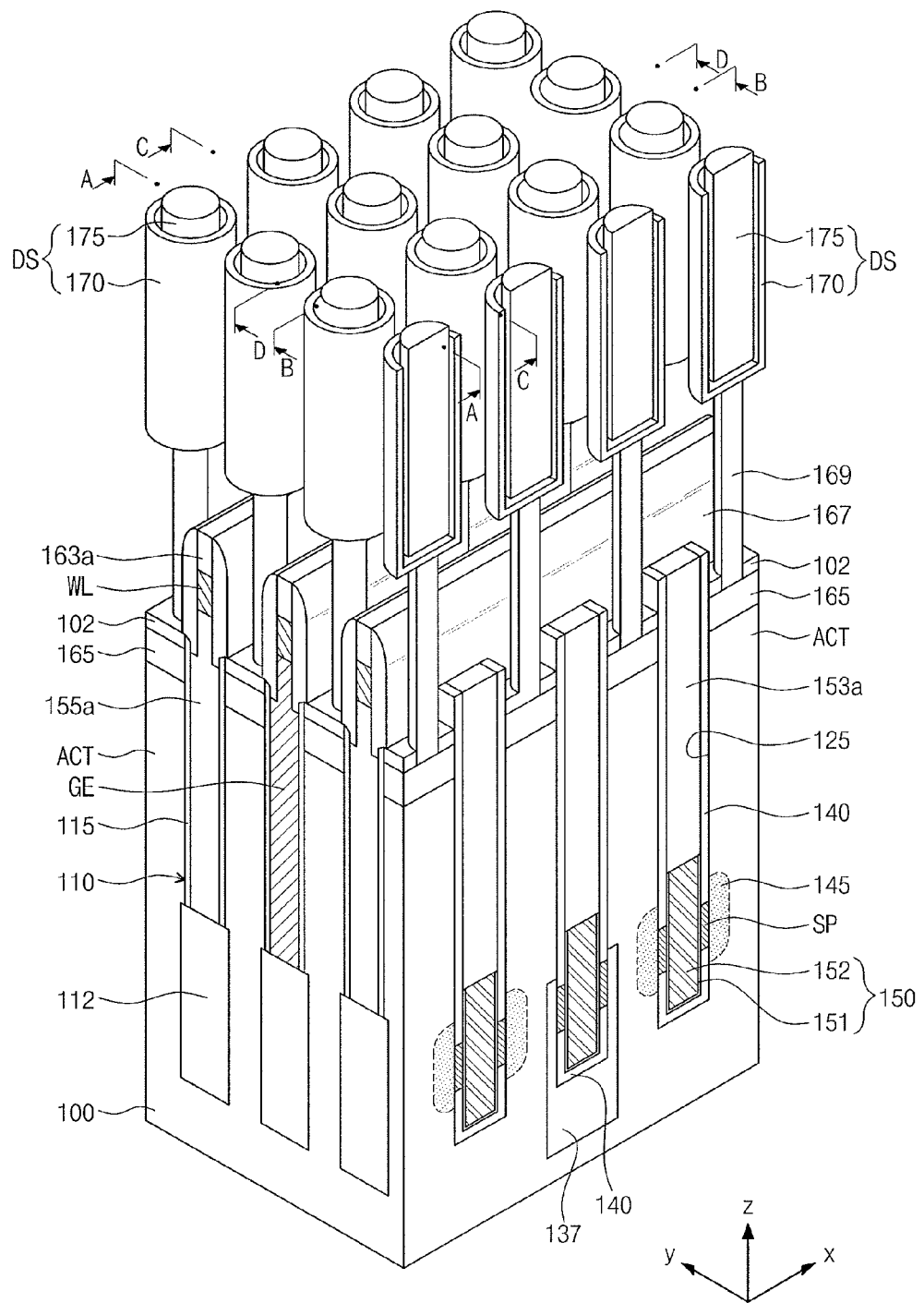
Figure 24B:
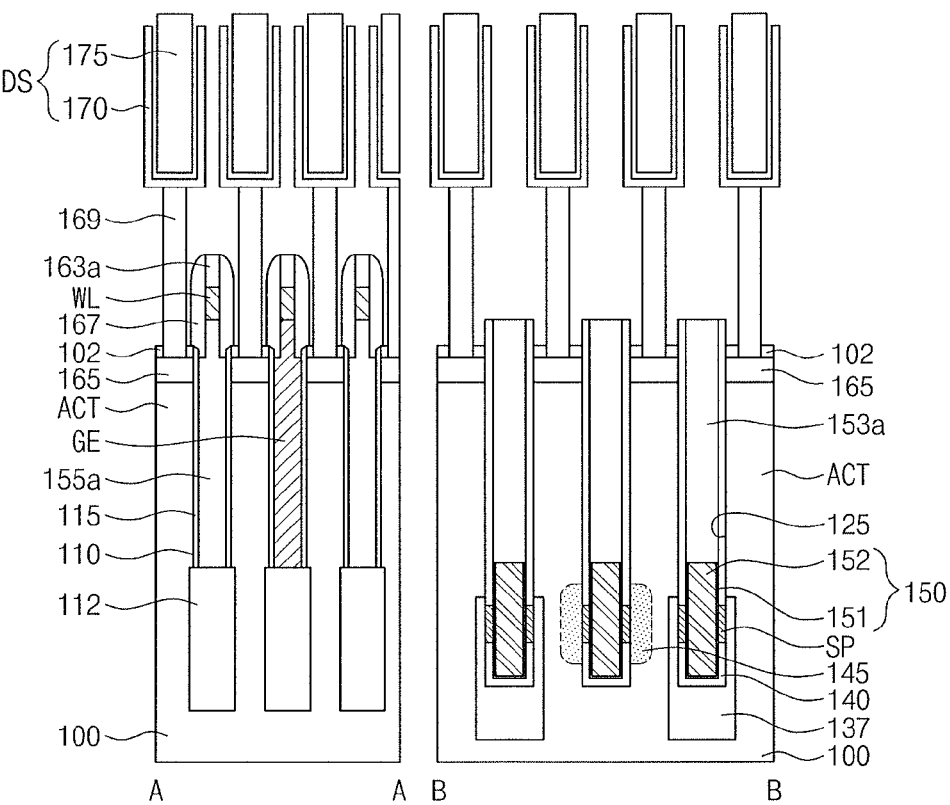
Figure 24B:
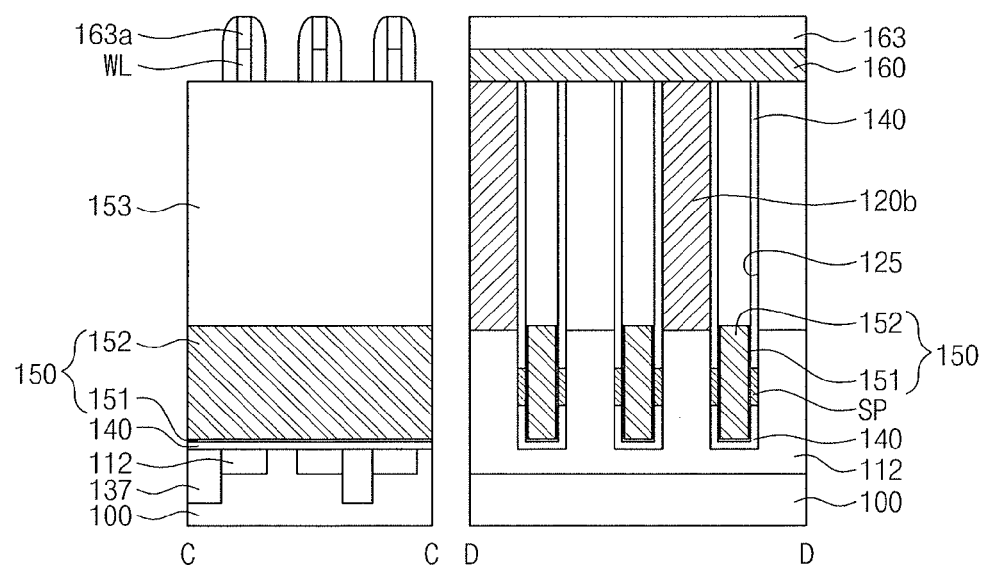

Referring to FIGS. 24A and 24B, gate spacers 167 may be formed on both sidewalls of the word line WL, and data-storing elements DS may be formed to be electrically connected to the upper doped regions 165, respectively. In example embodiments, the data-storing element DS may be a capacitor. For example, the data-storing element DS may include a first electrode 170, a second electrode 175, and a capacitor dielectric (not shown) interposed therebetween. However, example embodiments may not be limited thereto, e.g., the data-storing element DS may include at least one of phase-changeable materials (e.g., chalcogenide compounds), a magnetic structure (e.g., magnetic tunnel junction (MTJ)), or transition metal oxides.

Figure 25:
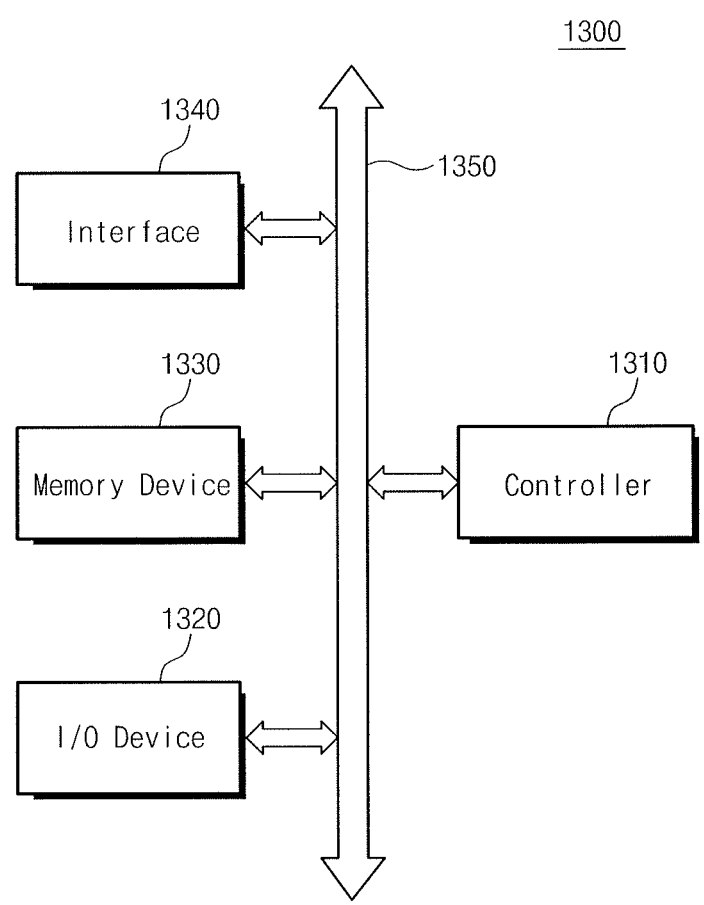
FIGS. 25 and 26 illustrate block diagrams of electronic apparatuses including a semiconductor device according to example embodiments.
Figure 26:
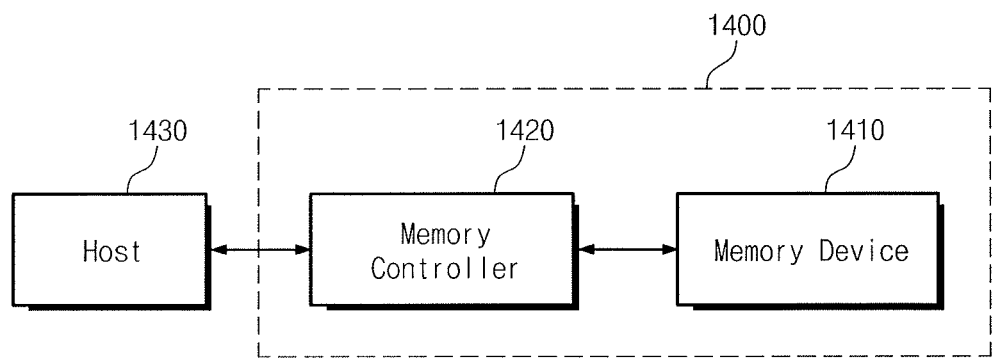

FIGS. 25 and 26 illustrate block diagrams of electronic devices including a semiconductor device according to example embodiments.

Referring to FIG. 25, an electronic device 1300 including a semiconductor device according to example embodiments may be used in o a personal digital assistant (PDA), a laptop computer, a mobile computer, a web tablet, a wireless phone, a cell phone, a digital music player, a wire or wireless electronic device, or a complex electronic device including at least two ones thereof. The electronic device 1300 may include a controller 1310, an input/output device 1320 such as a keypad, a keyboard, a display, a memory 1330, and a wireless interface 1340 that are combined to each other through a bus 1350. The controller 1310 may include, for example, at least one microprocessor, a digital signal process, a microcontroller, and the like.

The memory 1330 may be configured to store a command code to be used by the controller 1310 or a user data. The memory 1330 may include a semiconductor device according to example embodiments. The electronic device 1300 may use a wireless interface 1340 configured to transmit data to or receive data from a wireless communication network using a RF signal. The wireless interface 1340 may include, for example, an antenna, a wireless transceiver, etc. The electronic system 1300 may be used in a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, etc.

Referring to FIG. 26, a memory system including a semiconductor device according to example embodiments will be described. The memory system 1400 may include a memory device 1410 for storing huge amounts of data and a memory controller 1420. The memory controller 1420 may control the memory device 1410 so as to read data stored in the memory device 1410 or to write data into the memory device 1410 in response to a read/write request of a host 1430. The memory controller 1420 may include an address mapping table for mapping an address provided from the host 1430 (e.g., a mobile device or a computer system) into a physical address of the memory device 1410. The memory device 1410 may be a semiconductor device according to example embodiments.

The semiconductor memory devices disclosed above may be encapsulated using various and diverse packaging techniques. For example, the semiconductor memory devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

The package in which the semiconductor memory device according to one of the above embodiments is mounted may further include at least one semiconductor device (e.g., a controller and/or a logic device) that controls the semiconductor memory device.

By way of summation and review, a vertical channel transistor may have a source electrode and a drain electrode disposed at an upper side and a lower side of a channel region, respectively. According to exemplary embodiments, a lower impurity region coupled to a wiring or a buried bit line may be locally formed in a sidewall of an active region. As the result of the local formation of the lower impurity region, the vertical channel region may be electrically connected to a substrate located thereunder. Accordingly, the possibility of the vertical channel region being electrically floated may be reduced and/or prevented.

Further, exemplary embodiments relate to a semiconductor device with vertical channel transistors and a method of fabricating the same. According to exemplary embodiments, a vertical channel transistor may be formed to include localized lower doped regions. Accordingly, it may be possible to reduce the possibility of and/or prevent a channel region of the transistor from be electrically isolated. Embodiments also relate providing a method of fabricating a semiconductor device that may form a lower doped region locally.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of fabricating a semiconductor device, the method comprising:
   patterning a substrate to form a trench that defines an active region;
   forming a sacrificial pattern in a lower region of the trench;
   forming a spacer on an upper sidewall of the trench;
   recessing a top surface of the sacrificial pattern to form a window exposing a sidewall of the active region between the spacer and the sacrificial pattern;
   doping a sidewall of the trench through the window to form a doped region in the active region;
   forming a wiring in the trench to be connected to the doped region; and
   forming a semiconductor pattern in the trench, wherein forming the wiring includes:
   forming a metal layer in the trench having the semiconductor pattern therein,
   recessing the metal layer to form a metal pattern in the lower region of the trench, and
   forming an insulating gapfill layer to fill the trench provided with the metal pattern.

2. The method as claimed in claim 1, wherein forming the sacrificial pattern includes:
   forming an insulating layer to cover an inner surface of the trench,
   forming a sacrificial layer to fill the trench that has the insulating layer therein, and
   recessing the sacrificial layer to form the sacrificial pattern localized in the lower region of the trench.

3. The method as claimed in claim 2, wherein the spacer includes a material having etch selectivity with respect to at least one of the insulating layer and the sacrificial layer.

4. The method as claimed in claim 1, wherein:
   an upper boundary of the window is formed to be defined by a bottom surface of the spacer, and a lower boundary of the window is formed to be defined by an upper surface of the sacrificial pattern that has been recessed, and
   the doped region is formed spaced apart from a bottom surface of the trench.

5. The method as claimed in claim 1, wherein forming the doped region includes:
   forming a semiconductor layer to fill the trench that has the sacrificial pattern therein,
   anisotropically etching the semiconductor layer to form a semiconductor pattern locally remaining between the spacer and the sacrificial pattern,
   doping the semiconductor pattern with impurities, and
   diffusing the impurities into the active region.

6. The method as claimed in claim 1, wherein the doped region is formed to have a different conductivity type from the substrate.

7. The method as claimed in claim 1, further comprising removing the sacrificial pattern, after forming the window and before forming the wiring.

8. The method as claimed in claim 1, further comprising removing the spacer, after forming the window and before forming the wiring.

9. A method of fabricating a semiconductor device, the method comprising:
   forming a trench in a substrate;
   depositing a sacrificial pattern in a lower region of the trench;
   forming a spacer in an upper region of the trench, which trench has the sacrificial pattern in the lower region thereof;
   after forming the spacer, recessing the sacrificial pattern to form windows on opposite sides of the trench, the windows being between a lower side of the spacer and an upper side of the sacrificial pattern after being recessed;
   depositing and patterning a semiconductor layer in the trench such that semiconductor patterns fill the windows;
   doping sidewalls of the trench through the semiconductor patterns in the windows to form doped regions, respectively, in the substrate; and forming a wiring in the lower region of the trench between the semiconductor patterns, the wiring being commonly and electrically connected to the doped regions on opposite sides of the trench.

10. The method as claimed in claim 9, further comprising forming an insulating layer on the sidewalls of the trench before depositing the sacrificial pattern, and removing portions of the insulating layer from the windows before depositing and patterning the semiconductor layer such that the semiconductor patterns are embedded between remaining portions of the insulating layer.

11. The method as claimed in claim 9, further comprising depositing a gapfill pattern in the upper region of the trench such that the wiring is only in the lower region of the trench.

12. The method as claimed in claim 9, wherein:
   the semiconductor patterns are formed such that first sides of the semiconductor patterns are in direct contact with the sidewalls of the trench, respectively, and
   the wiring is formed such that second sides of the semiconductor patterns are in direct contact with the wiring.

13. The method as claimed in claim 9, wherein the trench is one of a plurality trenches that are formed in the substrate such that a plurality of vertical channel transistors are within the plurality of trenches, respectively.

14. The method as claimed in method 2, further comprising horizontally etching or removing a portion of the insulating layer before forming the insulating gapfill layer.

\* \* \* \* \*